United States Patent
Fujii et al.

(10) Patent No.: US 8,877,423 B2
(45) Date of Patent: Nov. 4, 2014

(54) ACTINIC RAY-SENSITIVE OR RADIATION-SENSITIVE RESIN COMPOSITION AND PATTERN FORMING METHOD USING THE SAME

(75) Inventors: Kana Fujii, Shizuoka (JP); Toru Fujimori, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 27 days.

(21) Appl. No.: 13/378,387

(22) PCT Filed: Jun. 30, 2010

(86) PCT No.: PCT/JP2010/061500
§ 371 (c)(1),
(2), (4) Date: Dec. 15, 2011

(87) PCT Pub. No.: WO2011/002102
PCT Pub. Date: Jan. 6, 2011

(65) Prior Publication Data
US 2012/0094237 A1    Apr. 19, 2012

(30) Foreign Application Priority Data
Jul. 3, 2009    (JP) .................................. 2009-159327

(51) Int. Cl.
G03F 7/004    (2006.01)
G03F 7/028    (2006.01)

(52) U.S. Cl.
USPC .................... 430/270.1; 430/913; 430/927

(58) Field of Classification Search
USPC ...................... 430/270.1, 913, 927
See application file for complete search history.

(56) References Cited

U.S. PATENT DOCUMENTS

| 5,629,135 | A | 5/1997 | Kobayashi et al. |
| 5,916,729 | A | 6/1999 | Kobayashi et al. |
| 6,114,086 | A | 9/2000 | Kobayashi et al. |
| 6,117,621 | A | 9/2000 | Hatakeyama et al. |
| 6,384,169 | B1 * | 5/2002 | Watanabe et al. ............. 526/346 |
| 6,656,660 | B1 | 12/2003 | Urano et al. |
| 6,921,621 | B2 | 7/2005 | Nitta et al. |
| 7,435,527 | B2 * | 10/2008 | Fujimori .................... 430/270.1 |
| 7,504,194 | B2 * | 3/2009 | Fukuhara et al. .......... 430/270.1 |
| 7,635,553 | B2 * | 12/2009 | Tarutani .................... 430/270.1 |

(Continued)

FOREIGN PATENT DOCUMENTS

| EP | 0908473 A1 | 4/1999 |
| EP | 0 919 867 A2 | 6/1999 |

(Continued)

OTHER PUBLICATIONS

Machine translation of JP 2006-018016 (no date).*

(Continued)

Primary Examiner — Amanda C. Walke
(74) Attorney, Agent, or Firm — Sughrue Mion, PLLC

(57) ABSTRACT

An actinic ray-sensitive or radiation-sensitive resin composition including: (A) a resin that contains a repeating unit represented by formula (I) as defined in the specification, a repeating unit represented by formula (II) as defined in the specification and a repeating unit represented by formula (III-a) or (III-b) as defined in the specification; (B) a compound capable of generating an acid upon irradiation with an actinic ray or radiation; and (C) a solvent, wherein the solvent (C) contains ethyl lactate, and a film and a pattern forming method using the composition are provided.

13 Claims, 1 Drawing Sheet

(56) References Cited

U.S. PATENT DOCUMENTS

| | | | |
|---|---|---|---|
| 7,691,558 B2 * | 4/2010 | Wada | 430/270.1 |
| 7,790,351 B2 * | 9/2010 | Fukuhara et al. | 430/270.1 |
| 8,084,187 B2 * | 12/2011 | Mizutani et al. | 430/270.1 |
| 8,092,978 B2 * | 1/2012 | Yamashita | 430/270.1 |
| 8,110,335 B2 * | 2/2012 | Takeda et al. | 430/270.1 |
| 8,114,571 B2 * | 2/2012 | Ohashi et al. | 430/270.1 |
| 8,168,367 B2 * | 5/2012 | Watanabe et al. | 430/270.1 |
| 8,187,789 B2 * | 5/2012 | Yonemura et al. | 430/270.1 |
| 8,361,693 B2 * | 1/2013 | Masunaga et al. | 430/270.1 |
| 2003/0190550 A1 | 10/2003 | Nittal et al. | |
| 2004/0002017 A1 | 1/2004 | Adams et al. | |
| 2005/0112498 A1 | 5/2005 | Nitta et al. | |
| 2006/0251986 A1 | 11/2006 | Sato et al. | |
| 2007/0042291 A1 | 2/2007 | Sato | |
| 2007/0148584 A1 | 6/2007 | Takeda et al. | |

FOREIGN PATENT DOCUMENTS

| | | | |
|---|---|---|---|
| EP | 1816519 A1 | 8/2007 | |
| JP | 10-326017 A | 12/1998 | |
| JP | 2000-181065 A | 6/2000 | |
| JP | 2000-284482 A | 10/2000 | |
| JP | 2001-166478 A | 6/2001 | |
| JP | 2003-149814 A | 5/2003 | |
| JP | 3544217 B2 | 4/2004 | |
| JP | 2006018016 A | * | 1/2006 |
| JP | 2007-052107 A | 3/2007 | |
| WO | WO 03/003121 A1 | 1/2003 | |
| WO | 2006/003810 A1 | 1/2006 | |
| WO | 2009/035044 A1 | 3/2009 | |

OTHER PUBLICATIONS

Communication from the European Patent Office issued Nov. 22, 2012 in counterpart European Application No. 10794269.0.

International Search Report from the International Searching Authority [PCT/ISA/210], dated Aug. 3, 2010, issued in International Application No. PCT/JP2010/061500.

Written Opinion of the International Searching Authoriuty [PCT/ISA/237], dated Aug. 3, 2010, issued in International Application No. PCT/JP2010/061500.

Office Action dated Jul. 4, 2014, issued by the Taiwanese Patent Office in corresponding Taiwanese Patent Application No. 99121767.

* cited by examiner

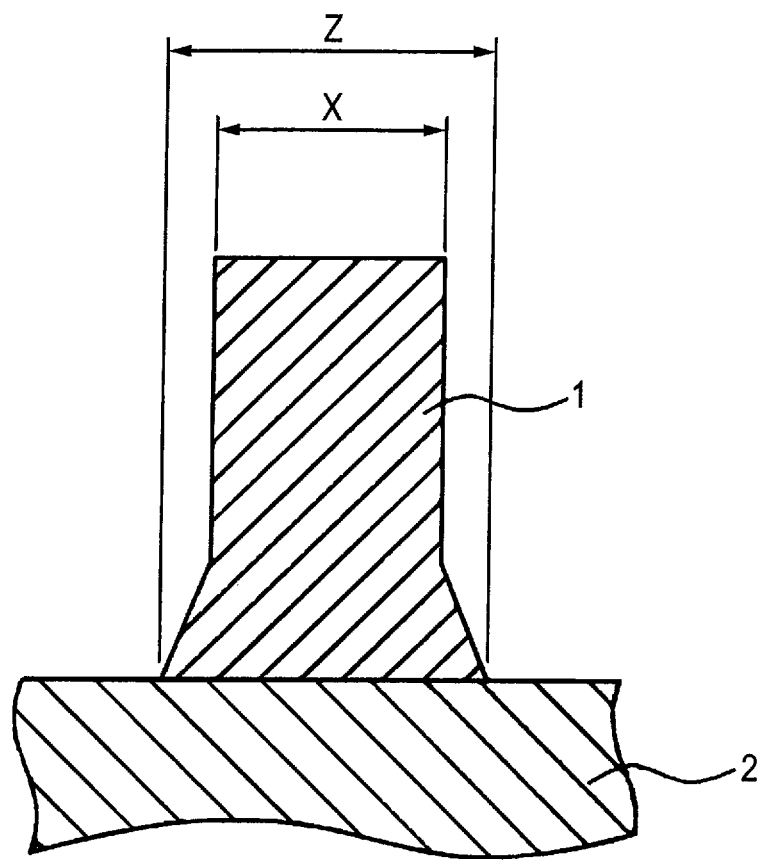

ACTINIC RAY-SENSITIVE OR RADIATION-SENSITIVE RESIN COMPOSITION AND PATTERN FORMING METHOD USING THE SAME

TECHNICAL FIELD

The present invention relates to an actinic ray-sensitive or radiation-sensitive resin composition suitable for use in the ultramicrolithography process such as production of VLSI or a high-capacity microchip or in other photofabrication processes, and a pattern forming method using the same. More specifically, the present invention relates to an actinic ray-sensitive or radiation-sensitive resin composition capable of forming a highly refined pattern by using KrF excimer laser light, ArF excimer laser light, electron beam, EUV light or the like, and a pattern forming method using the composition, that is, the present invention relates to an actinic ray-sensitive or radiation-sensitive resist composition suitably usable for microfabricating a semiconductor device by using KrF excimer laser light, ArF excimer laser light, electron beam or EUV light, and a pattern forming method using the composition.

BACKGROUND ART

In the process of producing a semiconductor device such as IC and LSI, microfabrication by lithography using a photoresist composition has been conventionally performed. Recently, the integration degree of an integrated circuit is becoming higher and formation of an ultrafine pattern in the sub-micron or quarter-micron region is required. To cope with this requirement, the exposure wavelength also tends to become shorter, for example, from g line to i line or further to KrF excimer laser light. At present, other than the excimer laser light, development of lithography using electron beam, X-ray or EUV light is proceeding.

The lithography using electron beam or EUV light is positioned as a next-generation or next-next-generation pattern formation technique, and a high-sensitivity and high-resolution resist is being demanded. Also, in the so-called nanoimprint process aiming at formation of a pattern with a line width of 22 nm or less, it is expected to apply electron beam lithography for the preparation of a fine mold. In particular, the elevation of sensitivity for shortening the processing time is very important but in the positive resist for electron beam or EUV, when elevation of sensitivity is sought for, not only reduction of resolution but also worsening of line edge roughness (LER) are brought about, and development of a resist satisfying these properties at the same time is strongly demanded. The high sensitivity is in a trade-off relationship with high resolution and good LER, and it is very important how satisfy all of these properties.

Also in the lithography using ArF or KrF excimer laser light, it is similarly an important task to satisfy high sensitivity, high resolution and good LER at the same time.

Furthermore, in the process typified by a metal process, the sensitivity, resolution, focus latitude (DOF) performance, LER, skirt trailing and pattern surface roughness are the issues of concern. In particular, LER and pattern surface roughness are in a trade-off relationship with resolution, and mere enhancement of diffusibility of the acid generated incurs decrease of the resolution. It is very important how satisfy all of these properties.

As for the resist suitable for such a lithography process using KrF excimer laser light, electron beam or EUV light, a chemical amplification resist utilizing an acid catalytic reaction is mainly used from the standpoint of elevating the sensitivity. In the case of a positive resist, as described, for example, in JP-A-2000-181065 (the term "JP-A" as used herein means an "unexamined published Japanese patent application", a chemical amplification resist composition mainly composed of an acid generator and a phenolic polymer having a property of being insoluble or sparingly soluble in an aqueous alkali solution but becoming soluble in an aqueous alkali solution by the action of an acid (hereinafter simply referred to as a "phenolic acid-decomposable resin"), is being effectively used.

Various positive resist compositions containing a resin protected by an acid-decomposable group have been heretofore known. For example, European Patent 0919867 discloses a resist composition using a polyhydroxystyrene resin protected by an acetal group, JP-A-2000-284482 discloses a resist composition using a polystyrene resin protected by two different kinds of acid-decomposable groups, and Japanese Patent 3544217 discloses a resist composition using, as the resist solvent, ethyl lactate, propylene glycol alkyl ether and/or propylene glycol alkyl ether acetate.

However, at present, in all of these attempts for improvement, high sensitivity, high resolution, wide focus latitude (DOF) performance, improvement of LER, reduction of skirt trailing, and reduction of pattern surface roughness cannot be satisfied at the same time.

SUMMARY OF INVENTION

An object of the present invention is to solve the technical task of enhancing the performance in microfabricating a semiconductor device by using an actinic ray or radiation, particularly electron beam, X-ray, KrF excimer laser light or ArF excimer laser light, and provide an actinic ray-sensitive or radiation-sensitive resin composition ensuring that the sensitivity and resolution are high, the performance in terms of focus latitude (DOF) and line edge roughness (LER) is excellent, and the pattern can be reduced in the skirt trailing and pattern surface roughness, and a pattern forming method using the composition.

The present invention can be achieved by the following configurations.

(1) An actinic ray-sensitive or radiation-sensitive resin composition, comprising:

(A) a resin that contains a repeating unit represented by the following formula (I), a repeating unit represented by the following formula (II) and a repeating unit represented by the following formula (III-a) or (III-b);

(B) a compound capable of generating an acid upon irradiation with an actinic ray or radiation; and (C) a solvent, wherein the solvent (C) contains ethyl lactate:

-continued

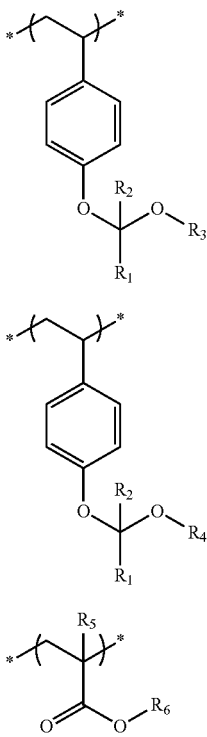

wherein in formula (II), each of $R_1$ and $R_2$ independently represents a hydrogen atom, an alkyl group or a cycloalkyl group, and $R_3$ represents an alkyl group;

in formula (III-a), each of $R_1$ and $R_2$ independently represents a hydrogen atom, an alkyl group or a cycloalkyl group, and $R_4$ represents a group containing a cycloalkyl group; and in formula (III-b), $R_5$ represents a hydrogen atom or an alkyl group, and $R_6$ represents a group containing a cycloalkyl group.

(2) The actinic ray-sensitive or radiation-sensitive resin composition as described in (1) above, wherein in formula (II), either one of $R_1$ and $R_2$ is a hydrogen atom; and in formula (III-a), either one of $R_1$ and $R_2$ is a hydrogen.

(3) The actinic ray-sensitive or radiation-sensitive resin composition as described in (1) or (2) above, wherein the repeating unit represented by formula (III-a) or (III-b) is a repeating unit represented by the following formula (III-a') or (III-b'):

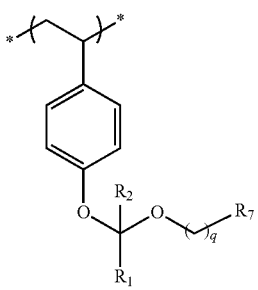

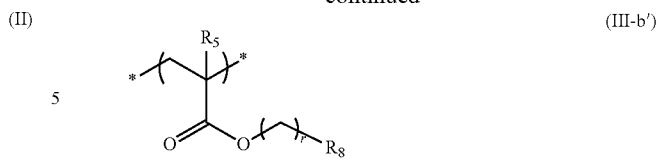

wherein in formula (III-a'), each of $R_1$ and $R_2$ independently represents a hydrogen atom, an alkyl group or a cycloalkyl group, $R_7$ represents a cycloalkyl group, and q represents an integer of 0 or more; and in formula (III-b'), $R_5$ represents a hydrogen atom or an alkyl group, $R_9$ represents a cycloalkyl group, and r represents an integer of 0 or more.

(4) The actinic ray-sensitive or radiation-sensitive resin composition as described in (3) above, wherein in formula (III-a'), q is an integer of 0 to 2; and in formula (III-b'), r is an integer of 0 or 1.

(5) The actinic ray-sensitive or radiation-sensitive resin composition as described in any one of (1) to (4) above, wherein a ratio of the repeating unit represented by formula (III-a) or (III-b) is from 1 to 30 mol % based on all repeating units of the resin (A).

(6) The actinic ray-sensitive or radiation-sensitive resin composition as described in any one of (1) to (5) above, wherein the repeating unit represented by formula (III-a) or (III-b) is a repeating unit represented by formula (III-b), and the group containing a cycloalkyl group represented by $R_6$ in formula (III-b) is a group incapable of leaving by an action of an acid.

(7) The actinic ray-sensitive or radiation-sensitive resin composition as described in any one of (1) to (6) above, wherein a ratio of ethyl lactate is from 10 to 40 mass % based on the entire amount of the solvent (C).

(8) The actinic ray-sensitive or radiation-sensitive resin composition as described in any one of (1) to (7) above, wherein the compound (B) contains at least either one of a diazodisulfone compound and a sulfonium salt.

(9) A film that is formed from the actinic ray-sensitive or radiation-sensitive resin composition described in any one of (1) to (8) above.

(10) A pattern forming method, comprising:

forming a film from the actinic ray-sensitive or radiation-sensitive resin composition described in any one of (1) to (8) above; and exposing and developing the film.

BRIEF DESCRIPTION OF DRAWING

FIG. 1 is a view for explaining the evaluation method of pattern in Examples.

DESCRIPTION OF EMBODIMENTS

The present invention is described in detail below.

Incidentally, in the present invention, when a group (atomic group) is denoted without specifying whether substituted or unsubstituted, the group includes both a group having no substituent and a group having a substituent. For example, "an alkyl group" includes not only an alkyl group having no substituent (unsubstituted alkyl group) but also an alkyl group having a substituent (substituted alkyl group).

In the present invention, the term "actinic ray" or "radiation" indicates, for example, a bright line spectrum of mercury lamp, a far ultraviolet ray typified by excimer laser, an extreme-ultraviolet ray (EUV light), an X-ray or an electron beam. Also, in the present invention, the "light" means an actinic ray or radiation.

Furthermore, in the present invention, unless otherwise indicated, the "exposure" includes not only exposure to a mercury lamp, a far ultraviolet ray typified by excimer laser, an X-ray, EUV light or the like but also lithography with a particle beam such as electron beam and ion beam.

[1] Resin (A)

The actinic ray-sensitive or radiation-sensitive resin composition of the present invention comprises (A) a resin containing a repeating unit represented by the following formula (I), a repeating unit represented by the following formula (II) and a repeating unit represented by the following formula (III-a) or (III-b) (hereinafter, sometimes referred to as a "resin (A)"):

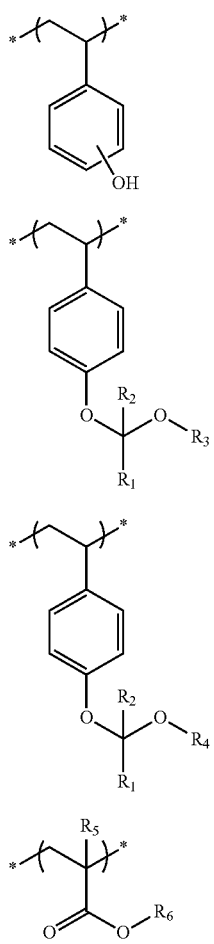

(wherein in formula (II), each of $R_1$ and $R_2$ independently represents a hydrogen atom, an alkyl group or a cycloalkyl group, and $R_3$ represents an alkyl group;

in formula (III-a), each of $R_1$ and $R_2$ independently represents a hydrogen atom, an alkyl group or a cycloalkyl group, and $R_4$ represents a group containing a cycloalkyl group; and in formula (III-b), $R_5$ represents a hydrogen atom or an alkyl group, and $R_6$ represents a group containing a cycloalkyl group).

The repeating unit represented by formula (I) is described below.

In the present invention, the resin (A) preferably contains, as the repeating unit represented by formula (I), at least either one of a repeating unit represented by formula (I-a) and a repeating unit represented by formula (I-b) and may contain both. In the case of containing both, one kind of a resin (A) may contain both a repeating unit represented by formula (I-a) and a repeating unit represented by formula (I-b), but when two or more kinds of resins (A) are used in combination, a resin containing the repeating unit represented by formula (I-a) and another resin containing the repeating unit represented by formula (I-b) may be mixed.

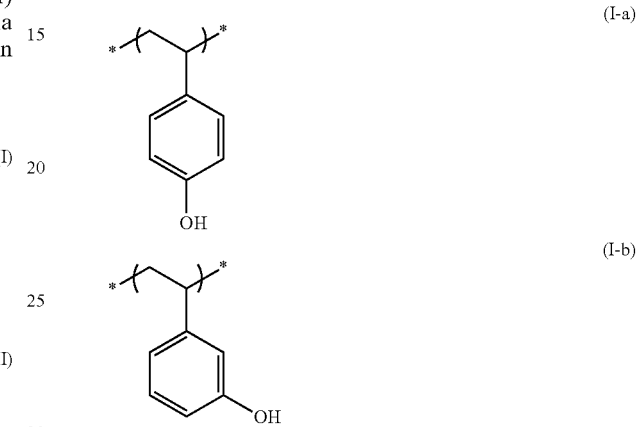

The compositional ratio of the repeating unit represented by formula (I) in the rein (A) is preferably from 55 to 85 mol % based on all repeating units in the resin (A).

In the case where the resin (A) contains a repeating unit represented by formula (I-a) as the repeating unit represented by formula (I), the compositional ratio of the repeating unit represented by formula (I-a) is preferably from 55 to 75 mol % based on all repeating units in the resin (A), and in the case where the resin (A) further contains a repeating unit represented by formula (I-b), the compositional ratio of the repeating unit represented by formula (I-b) is preferably from 0 to 20 mol % based on all repeating units in the resin (A).

The compositional ratio of the repeating unit represented by formula (I) is preferably in the range above from the standpoint of satisfying both good pattern profile and defect performance.

The repeating unit represented by formula (II) is described blow.

The repeating unit represented by formula (II) is indicated by the following structure:

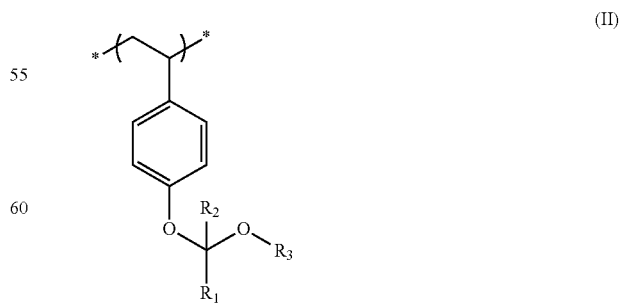

(wherein each of $R_1$ and $R_2$ independently represents a hydrogen atom, an alkyl group or a cycloalkyl group, and $R_3$ represents an alkyl group).

The alkyl group as $R_1$, $R_2$ and $R_3$ may have a substituent and may be either linear or branched. The linear alkyl group is preferably a linear alkyl group having a carbon number of 1 to 30, more preferably from 1 to 20, and examples thereof include a methyl group, an ethyl group, an n-propyl group, an n-butyl group, a sec-butyl group, a tert-butyl group, an n-pentyl group, an n-hexyl group, an n-heptyl group, an n-octyl group, an n-nonyl group and an n-decanyl group. The branched alkyl group is preferably a branched alkyl group having a carbon number of 3 to 30, more preferably from 3 to 20, and examples thereof include an i-propyl group, an i-butyl group, a tert-butyl group, an i-pentyl group, a tert-pentyl group, an i-hexyl group, a tert-hexyl group, an i-heptyl group, a tert-heptyl group, an i-octyl group, tert-octyl group, an i-nonyl group and a tert-decanoyl group.

The alkyl group as $R_1$ and $R_2$ is preferably an alkyl group having a carbon number of 1 to 3, more preferably a methyl group, an ethyl group or an i-propyl group, still more preferably a methyl group.

The alkyl group as $R_3$ is preferably an alkyl group having a carbon number of 1 to 6, more preferably a methyl group, an ethyl group, an i-propyl group or an n-pentyl group, still more preferably an ethyl group.

The cycloalkyl group as $R_1$ and $R_2$ may have a substituent. The cycloalkyl group includes a cycloalkyl group which may be monocyclic or polycyclic, and is preferably a monocyclic cycloalkyl group having a carbon number of 3 to 8, such as cyclopropyl group, cyclopentyl group and cyclohexyl group. Examples of the cycloalkyl group include a bicycloalkyl group and a tricycloalkyl group.

The cycloalkyl group as $R_1$ and $R_2$ is preferably a monocyclic cycloalkyl group and is preferably a cyclohexyl group.

Examples of the substituent which the alkyl group and cycloalkyl group above may have include a hydroxyl group, a cycloalkyl group (specific examples thereof are the same as specific examples of the cycloalkyl group as $R_1$ and $R_2$), a halogen atom (e.g., fluorine, chlorine, bromine, iodine), a nitro group, a cyano group, an alkoxy group such as methoxy group, ethoxy group, hydroxyethoxy group, propoxy group, hydroxypropoxy group, n-butoxy group, isobutoxy group, sec-butoxy group and tert-butoxy group, an alkoxycarbonyl group such as methoxycarbonyl group and ethoxycarbonyl group, an aralkyl group such as benzyl group, phenethyl group and cumyl group, an aralkyloxy group, an acyl group such as formyl group, acetyl group, butyryl group, benzoyl group, cinnamyl group and valeryl group, an acyloxy group such as butyryloxy group, an alkenyl group such as vinyl group, propenyl group, allyl group and butenyl group, an alkenyloxy group such as vinyloxy group, propenyloxy group, allyloxy group and butenyloxy group, an aryl group such as phenyl group, naphthyl group, anthryl group, phenanthryl group, indenyl group, acenaphthenyl group, fluorenyl group and pyrenyl group, an aryloxy group such as phenoxy group, an aryloxycarbonyl group such as benzoyloxy group, and a group formed by combining such a group and a divalent linking group (e.g., phenylene group, ether group, thioether group, carbonyl group, ester group, amide group, urethane group, ureylene group).

Examples of the substituent which the cycloalkyl group may have further include an alkyl group in addition to the groups set forth above, and specific examples of this alkyl group are the same as specific examples of the alkyl group as $R_1$ and $R_2$.

The carbon number of the substituent is preferably 15 or less.

In the repeating unit represented by formula (II), either one of $R_1$ and $R_2$ is preferably a hydrogen atom in view of reactivity for deprotection by an acid.

The compositional ratio of the repeating unit represented by formula (II) in the resin (A) is preferably from 14 to 40 mol % based on all repeating units in the resin (A).

Specific examples of the structure for the repeating unit represented by formula (II) are set forth below, but the present invention is not limited thereto.

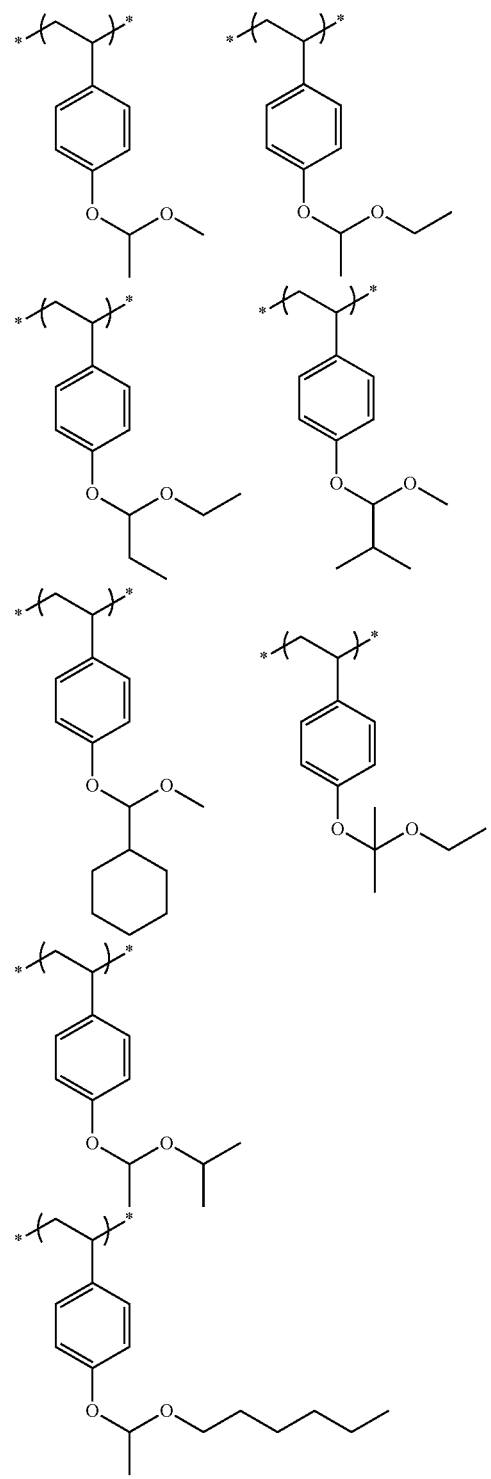

The repeating unit represented by formula (III-a) or (III-b) is described below. Both the repeating unit represented by formula (III-a) and the repeating unit represented by formula (III-b) have a cycloalkyl group on the side chain, and although the reasons are not clearly known, when a resin containing such a repeating unit having a cycloalkyl group on the side chain and containing a repeating unit represented by formula (I) and a repeating unit represented by formula (II) is contained in the resist composition, the effects of the present invention are obtained.

The repeating unit represented by formula (III-a) and the repeating unit represented by formula (III-b) are indicated by the following structures, respectively:

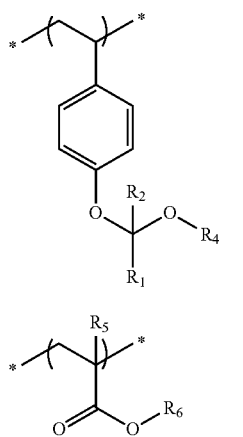

(III-a)

(III-b)

The repeating unit represented by formula (III-a) is described below.

In the repeating unit represented by formula (III-a), each of $R_1$ and $R_2$ independently represents a hydrogen atom, an alkyl group or a cycloalkyl group.

Specific examples and preferred examples of the alkyl group as $R_1$ and $R_2$ are the same as those described above for the alkyl group as $R_1$ and $R_2$ in formula (II).

Specific examples and preferred examples of the cycloalkyl group as $R_1$ and $R_2$ are the same as those described above for the cycloalkyl group as $R_1$ and $R_2$ in formula (II).

Also in the repeating unit represented by formula (III-a), either one of $R_1$ and $R_2$ is preferably a hydrogen atom in view of reactivity.

In the repeating unit represented by formula (III-a), $R_4$ represents a group containing a cycloalkyl group. Specific examples and preferred examples of the cycloalkyl group in the cycloalkyl group-containing group as $R_4$ are the same as those described for the cycloalkyl group as $R_1$ and $R_2$ in formula (II), but a monocyclic cycloalkyl group is more preferred than a polycyclic cycloalkyl group.

The cycloalkyl group-containing group as $R_4$ may have a substituent.

Specific examples of the substituent which the group containing a cycloalkyl group may have are the same as those of the substituent which the cycloalkyl group as $R_1$ and $R_2$ in formula (II) may have.

The cycloalkyl group-containing group as $R_4$ include, in addition to a cycloalkyl group itself, a group formed by combining one or more divalent linking groups (e.g., alkylene group, phenylene group, ether group, thioether group, carbonyl group, ester group, amide group, urethane group, urea group) and a cycloalkyl group, but a cycloalkyl group-containing alkyl group (a group formed by combining an alkylene group and a cycloalkylene group) is preferred.

The total carbon number of the group containing a cycloalkyl group is preferably from 3 to 20.

The repeating unit represented by formula (III-a) is preferably a repeating unit represented by formula (III-a').

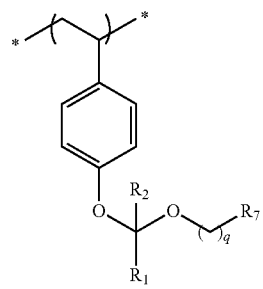

(III-a')

In formula (III-a'), each of $R_1$ and $R_2$ independently represents a hydrogen atom, an alkyl group or a cycloalkyl group, $R_7$ represents a cycloalkyl group, and q represents an integer of 0 or more.

Specific examples and preferred examples of the alkyl group as $R_1$ and $R_2$ are the same as those described above for the alkyl group as $R_1$ and $R_2$ in formula (II).

Specific examples and preferred examples of the cycloalkyl group as $R_1$ and $R_2$ are the same as those described above for the cycloalkyl group as $R_1$ and $R_2$ in formula (II).

Specific examples of the cycloalkyl group as $R_7$ are the same as those described for the cycloalkyl group as $R_1$ and $R_2$ in formula (II). The cycloalkyl group is preferably a monocyclic or polycyclic cycloalkyl group having a carbon number of 3 to 8, and preferred examples thereof include a cyclopentyl group, a cyclohexyl group and a 2-bicyclo[2.2.1]heptyl group. A monocyclic cycloalkyl group is more preferred than a polycyclic cycloalkyl group.

The cycloalkyl group in $R_7$ may have a substituent, and specific examples of the substituent are the same as specific examples of the substituent which the cycloalkyl group as $R_1$ and $R_2$ above may have. Among these, an alkyl group, a cycloalkyl group, an aryl group and a halogen atom are preferred.

q is preferably an integer of 0 to 2.

Specific examples of the structure for the repeating unit represented by formula (III-a) or (III-a') are set forth below, but the present invention is not limited thereto.

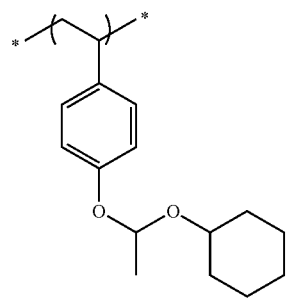

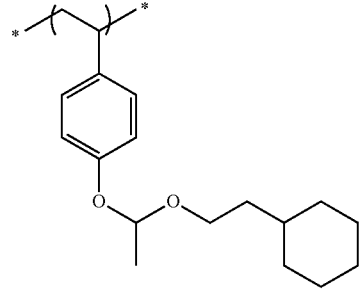

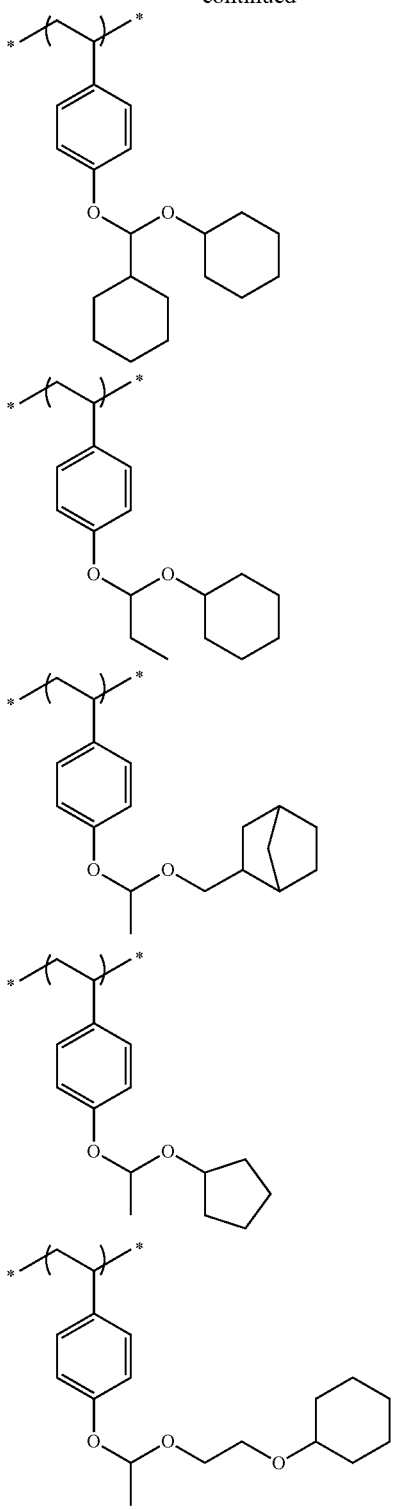

The repeating unit represented by formula (III-b) is described below.

In the repeating unit represented by formula (III-b), $R_5$ represents a hydrogen atom or an alkyl group. The alkyl group as $R_5$ may have a substituent, and specific examples and preferred examples of the alkyl group as $R_5$ and the substituent which the alkyl group may have are the same as those described for the alkyl group as $R_1$ and $R_2$ in formula (II). In particular, $R_5$ is preferably a methyl group.

$R_6$ represents a group containing a cycloalkyl group. Specific examples and preferred examples of the cycloalkyl group in the cycloalkyl group-containing group as $R_6$ are the same as those described for the cycloalkyl group as $R_1$ and $R_2$ in formula (II). A monocyclic cycloalkyl group is more preferred than a monocyclic cycloalkyl group.

The cycloalkyl group-containing group as $R_6$ may have a substituent.

Specific examples of the substituent which the group containing a cycloalkyl group may have are the same as those of the substituent which the cycloalkyl group as $R_1$ and $R_2$ in formula (II) may have.

Examples of the cycloalkyl group-containing group as $R_6$ are the same as those described for the cycloalkyl group-containing group as $R_4$.

The repeating unit represented by formula (III-b) is preferably a repeating unit represented by formula (III-b').

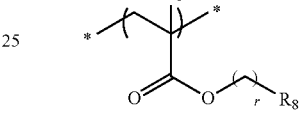

(III-b')

In formula (III-b'), $R_5$ represents a hydrogen atom or an alkyl group, $R_8$ represents a cycloalkyl group, and r represents an integer of 0 or more.

Specific examples and preferred examples of the alkyl group as $R_5$ are the same as those of the alkyl group as $R_5$ in formula (III-b).

Specific examples of the cycloalkyl group as $R_8$ are the same as those described for the cycloalkyl group as $R_1$ and $R_2$ in formula (II). The cycloalkyl group is preferably a monocyclic or polycyclic cycloalkyl group having a carbon number of 3 to 8, and preferred examples thereof include a cyclopentyl group, a cyclohexyl group and a 2-bicyclo[2.2.1]heptyl group. A monocyclic cycloalkyl group is more preferred than a polycyclic cycloalkyl group.

The cycloalkyl group in $R_8$ may have a substituent, and specific examples of the substituent are the same as specific examples of the substituent which the cycloalkyl group as $R_1$ and $R_2$ above may have. Among these, an alkyl group, a cycloalkyl group, an aryl group and a halogen atom are preferred.

r is preferably an integer of 0 or 1.

It is preferred that the repeating unit represented by formula (III-a) or (III-b) is a repeating unit represented by formula (III-b) and at the same time, the cycloalkyl group-containing group as $R_6$ in formula (III-b) is a group incapable of leaving by the action of an acid (that is, a group which does not leave by the action of an acid to generate a (meth)acrylic acid). Thanks to this configuration, more excellent performance can be achieved in terms of surface roughness, and other properties (sensitivity, resolution, DOF performance, skirt trailing in pattern) tend to be improved.

In general, examples of the group capable of leaving by the action of an acid include —$C(R_{36})(R_{37})(R_{38})$ and —$C(R_{01})(R_{02})(OR_{39})$.

Each of $R_{36}$ to $R_{39}$ independently represents an alkyl group, a cycloalkyl group, an aryl group, an aralkyl group or an alkenyl group. $R_{36}$ and $R_{37}$ may combine with each other to form a ring.

Each of $R_{01}$ and $R_{02}$ independently represents a hydrogen atom, an alkyl group, a cycloalkyl group, an aryl group, an aralkyl group or an alkenyl group.

Accordingly, the repeating unit represented by formula (III-a) or (III-b) is preferably a repeating unit represented by formula (III-b) where a group capable of leaving by the action of an acid set forth above is not included in $R_6$.

Specific examples of the structure for the repeating unit represented by formula (III-b) or (III-b') are set forth below, but the present invention is not limited thereto.

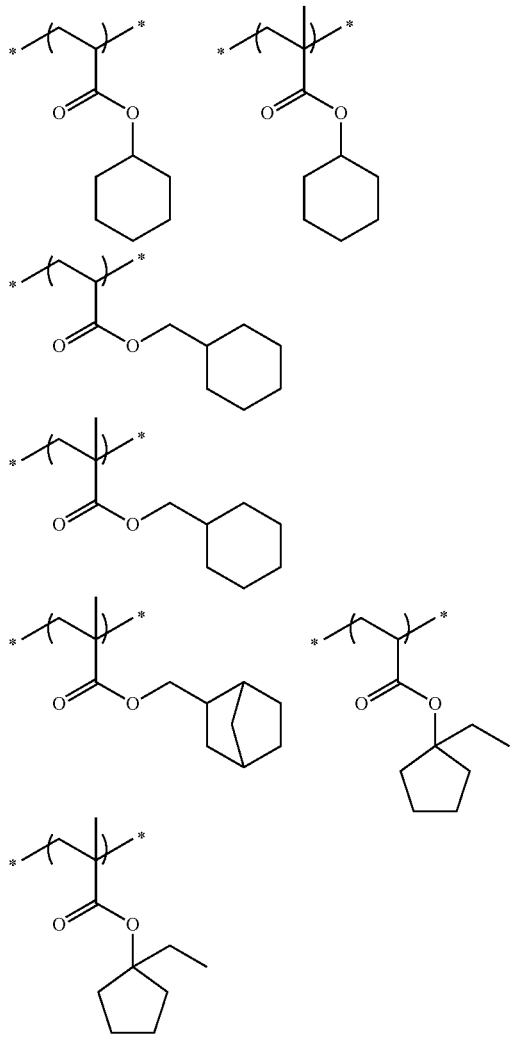

In five repeating units starting from the left out of specific examples above, the cycloalkyl group-containing group as $R_6$ in formula (III-b) is a group incapable of leaving by the action of an acid.

On the other hand, in two repeating units from the right out of specific examples above, the cycloalkyl group-containing group as $R_6$ in formula (III-b) is a group capable of leaving by the action of an acid.

The compositional ratio of the repeating unit represented by formula (III-a) or (III-b) in the rein (A) is preferably from 1 to 30 mol %, more preferably from 1 to 20 mol %, based on all repeating units in the resin (A). The compositional ratio is preferably 1 mol % or more because the surface roughness can be more unfailingly suppressed, and the compositional ratio is preferably 30 mol % or less from the standpoint that defects are hardly produced in the pattern obtained.

Accordingly, the resin (A) is preferably a resin containing from 55 to 85 mol % of a repeating unit represented by formula (I), from 14 to 40 mol % of a repeating unit represented by formula (II), and from 1 to 30 mol % of a repeating unit represented by formula (III-a) or (III-b), based on all repeating units in the resin (A).

The weight average molecular weight (Mw) of the resin (A) is preferably from 8,000 to 23,000, more preferably from 10,000 to 23,000. Within this range, it is considered that the glass transition temperature (Tg) of the resin rises and in turn, the mobility of the resin in the resist film lowers. As a result, diffusion of the acid generated can be suppressed, and various performances such as exposure latitude and standing wave are enhanced.

On the other hand, in view of the dissolution rate of the resin itself in an alkali developer, sensitivity and defect generation, the mass average molecular weight (Mw) is preferably 23,000 or less.

The polydispersity (Mw/Mn) of the resin (A) is preferably from 1.0 to 3.0, more preferably from 1.0 to 2.5, still more preferably from 1.0 to 2.0.

The weight average molecular weight as used herein is defined as a value determined in terms of polystyrene by gel permeation chromatography.

The content of the resin (A) in the composition is preferably from 80 to 99 mass %, more preferably from 85 to 99 mass %, still more preferably from 90 to 98 mass %, based on the entire solid content of the actinic ray-sensitive or radiation-sensitive resin composition of the present invention. (In this specification, mass ratio is equal to weight ratio.)

Specific examples of the resin (A) are set forth below, but the present invention is not limited thereto.

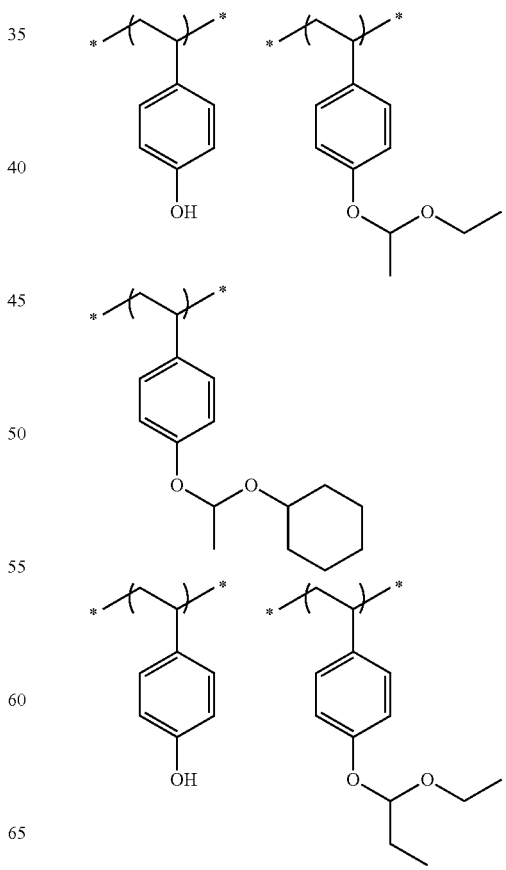

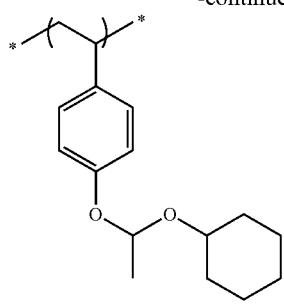
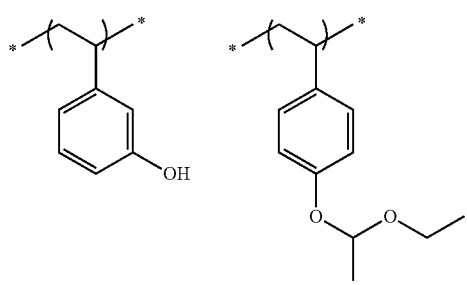
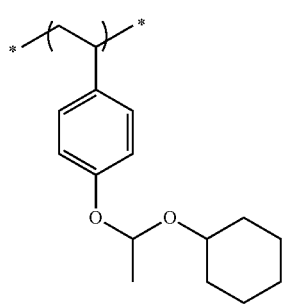
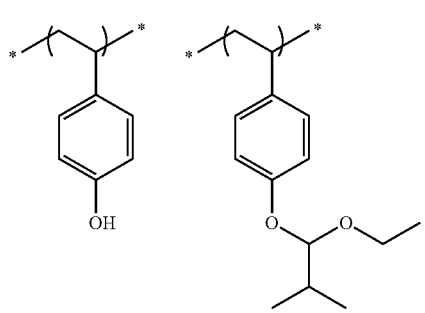
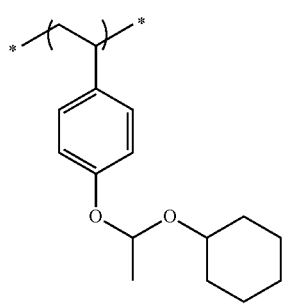
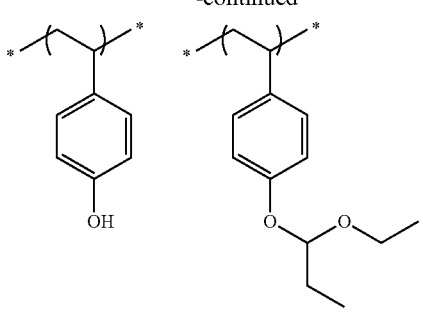
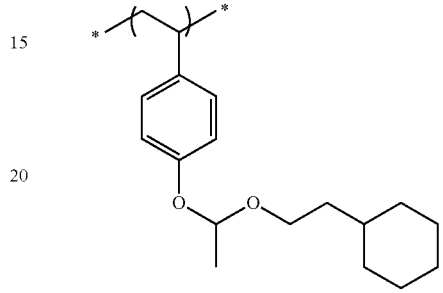
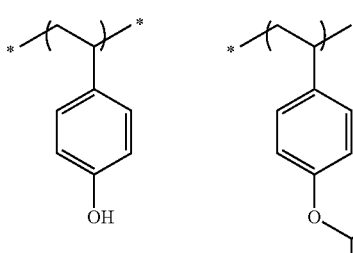
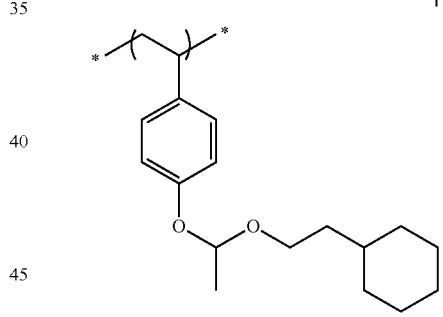
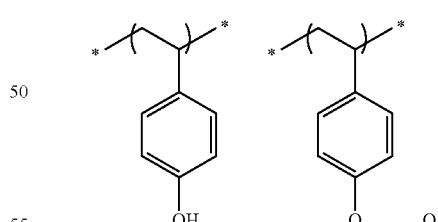
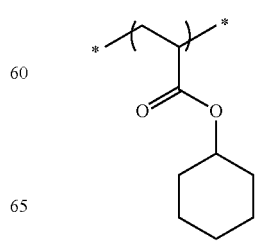

-continued

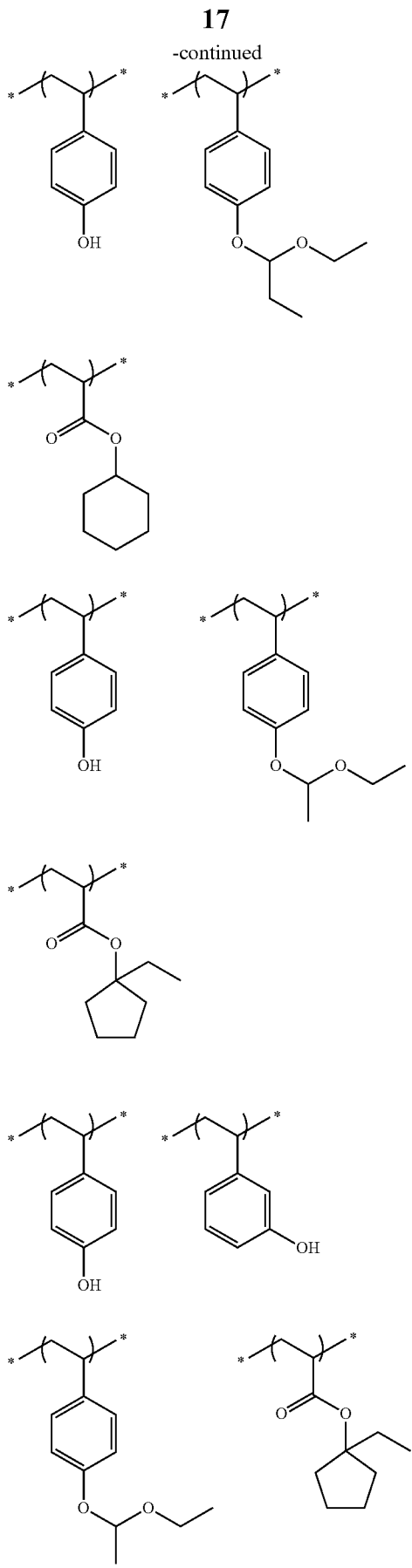

-continued

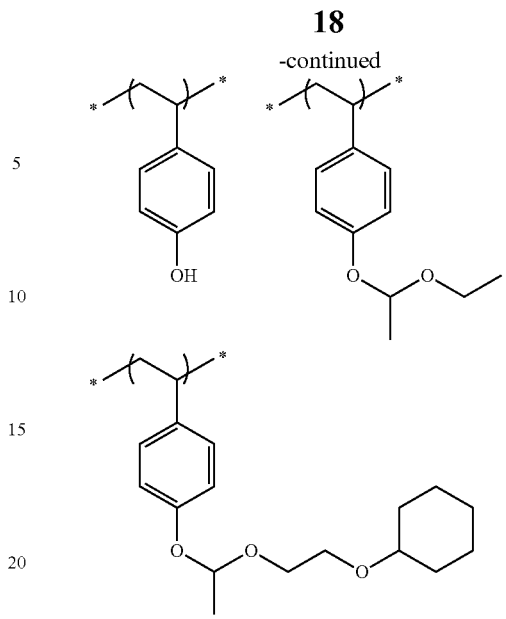

As for the resin (A), one kind of a resin may be used alone, or two or more kinds of resins may be used in combination.

[2] Acid Generator (B)

The actinic ray-sensitive or radiation-sensitive resin composition of the present invention contains (B) a compound capable of generating an acid upon irradiation with an actinic ray or radiation (hereinafter sometimes referred to as an "acid generator (B)"). The acid generator (B) which can be used may be appropriately selected from a photo-initiator for cationic photopolymerization, a photo-initiator for radical photopolymerization, a photo-decoloring agent for dyes, a photo-discoloring agent, a compound known to generate an acid upon irradiation with an actinic ray or radiation and used for microresist or the like, and a mixture thereof.

Out of the compounds capable of decomposing upon irradiation with an actinic ray or radiation to generate an acid, which are used as the acid generator (B), compounds represented by the following formulae (ZI), (ZII) and (ZIII) are preferred.

(ZI)

(ZII)

(ZIII)

In formula (ZI), each of $R_{201}$, $R_{202}$ and $R_{203}$ independently represents an organic group.

$Z^-$ represents a non-nucleophilic anion, and preferred examples thereof include sulfonate anion, bis(alkylsulfonyl)amide anion, tris(alkylsulfonyl)methide anion, $BF_4^-$, $PF_6^-$ and $SbF_6^-$. The anion is preferably an organic anion containing a carbon atom. Preferred organic anions include organic anions represented by the following formulae AN1 to AN3:

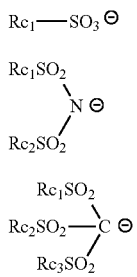

In formulae AN1 to AN3, each of $Rc_1$ to $Rc_3$ independently represents an organic group. The organic group in $Rc_1$ to $Rc_3$ includes an organic group having a carbon number of 1 to 30 and is preferably an alkyl group which may be substituted, an aryl group, or a group formed by connecting a plurality of these groups through a single bond or a linking group such as —O—, —$CO_2$—, —S—, —$SO_3$— and —$SO_2N(Rd_1)$—. Such a group may further form a ring structure together with another alkyl or aryl group bonded.

$Rd_1$ represents a hydrogen atom or an alkyl group and may form a ring structure together with the alkyl or aryl group to which $Rd_1$ is bonded.

The organic group of $Rc_1$ to $Rc_3$ may be an alkyl group substituted with a fluorine atom or fluoroalkyl group at the 1-position, or a phenyl group substituted with a fluorine atom or a fluoroalkyl group. By virtue of having a fluorine atom or a fluoroalkyl group, the acidity of the acid generated upon irradiation with light increases and the sensitivity is enhanced. When each of $Rc_1$ to $Rc_3$ has 5 or more carbon atoms, at least one carbon atom is preferably substituted with a hydrogen atom, and it is more preferred that the number of hydrogen atoms is larger than the number of fluorine atoms. The absence of a perfluoroalkyl group having a carbon number of 5 or more enables reduction in the toxicity to ecology.

The carbon number of the organic group as $R_{201}$, $R_{202}$ and $R_{203}$ is generally from 1 to 30, preferably from 1 to 20.

Two members out of $R_{201}$ to $R_{203}$ may combine to form a ring structure, and the ring may contain an oxygen atom, a sulfur atom, an ester bond, an amide bond or a carbonyl group.

The group formed by combining two members out of $R_{201}$ to $R_{203}$ includes an alkylene group (e.g., butylene group, pentylene group).

Specific examples of the organic group as $R_{201}$, $R_{202}$ and $R_{203}$ include the corresponding groups in the compounds (ZI-1), (ZI-2) and (ZI-3) which are described later.

The compound may be a compound having a plurality of structures represented by formula (ZI). For example, the compound may be a compound having a structure that at least one of $R_{201}$ to $R_{203}$ in the compound represented by formula (ZI) is bonded to at least one of $R_{201}$ to $R_{203}$ in another compound represented by formula (ZI).

The component (ZI) is more preferably a compound (ZI-1), (ZI-2) or (ZI-3) described below.

The compound (ZI-1) is an arylsulfonium compound where at least one of $R_{201}$ to $R_{203}$ in formula (ZI) is an aryl group, that is, a compound having an arylsulfonium as the cation.

In the arylsulfonium compound, all of $R_{201}$ to $R_{203}$ may be an aryl group or a part of $R_{201}$ to $R_{203}$ may be an aryl group with the remaining being an alkyl group.

Examples of the arylsulfonium compound include a triarylsulfonium compound, a diarylalkylsulfonium compound and an aryldialkylsulfonium compound.

The aryl group in the arylsulfonium compound is preferably an aryl group such as phenyl group and naphthyl group, or a heteroaryl group such as indole residue and pyrrole residue, more preferably a phenyl group or an indole residue. In the case where the arylsulfonium compound has two or more aryl groups, these two or more aryl groups may be the same or different.

The alkyl group which is present, if desired, in the arylsulfonium compound is preferably an alkyl (linear or branched) or cycloalkyl group having a carbon number of 1 to 15, and examples thereof include a methyl group, an ethyl group, a propyl group, an n-butyl group, a sec-butyl group, a tert-butyl group, a cyclopropyl group, a cyclobutyl group and a cyclohexyl group.

The aryl group and alkyl group as $R_{201}$ to $R_{203}$ may have, as the substituent, an alkyl group (for example, having a carbon number of 1 to 15), an aryl group (for example, having a carbon number of 6 to 14), an alkoxy group (for example, having a carbon number of 1 to 15), a halogen atom, a hydroxyl group or a phenylthio group. The substituent is preferably an alkyl (linear or branched) or cycloalkyl group having a carbon number of 1 to 12 or a linear, branched or cyclic alkoxy group having a carbon number of 1 to 12, and most preferably an alkyl group having a carbon number of 1 to 4 or an alkoxy group having a carbon number of 1 to 4. The substituent may be substituted on any one of three members $R_{201}$ to $R_{203}$ or may be substituted on all of these three members. In the case where $R_{201}$ to $R_{203}$ are an aryl group, the substituent is preferably substituted at the p-position of the aryl group.

The compound (ZI-2) is described below.

The compound (ZI-2) is a compound where each of $R_{201}$ to $R_{203}$ in formula (ZI) independently represents an aromatic ring-free organic group. The aromatic ring as used herein includes an aromatic ring containing a heteroatom.

The aromatic ring-free organic group as $R_{201}$ to $R_{203}$ has a carbon number of generally from 1 to 30, preferably from 1 to 20.

Each of $R_{201}$ to $R_{203}$ is independently preferably an alkyl group, a 2-oxoalkyl group, an alkoxycarbonylmethyl group, an allyl group or a vinyl group, more preferably a linear, branched or cyclic 2-oxoalkyl group or an alkoxycarbonylmethyl group, and most preferably a linear or branched 2-oxoalkyl group.

The alkyl group as $R_{201}$ to $R_{203}$ may be either linear, branched or cyclic but is preferably a linear or branched alkyl group having a carbon number of 1 to 10 (e.g., methyl group, ethyl group, propyl group, butyl group, pentyl group) or a cycloalkyl group having a carbon number of 3 to 10 (e.g., cyclopentyl group, cyclohexyl group, norbornyl group).

The 2-oxoalkyl group as $R_{201}$ to $R_{203}$ may be linear, branched or cyclic and is preferably a group having >C=O at the 2-position of the above-described alkyl group.

The alkoxy group in the alkoxycarbonylmethyl group as $R_{201}$ to $R_{203}$ includes an alkoxy group preferably having a carbon number of 1 to 5 (e.g., methoxy group, ethoxy group, propoxy group, butoxy group, pentoxy group).

Each of $R_{201}$ to $R_{203}$ may be further substituted with a halogen atom, an alkoxy group (for example, having a carbon number of 1 to 5), a hydroxyl group, a cyano group or a nitro group.

Two members out of $R_{201}$ to $R_{203}$ may combine to form a ring structure, and the ring may contain an oxygen atom, a sulfur atom, an ester bond, an amide bond or a carbonyl group. The group formed by combining two members out of $R_{201}$ to $R_{203}$ includes an alkylene group (e.g., butylene group, pentylene group).

The compound (ZI-3) is described below.

The compound (ZI-3) is a compound represented by the following formula (ZI-3), and this is a compound having a phenacylsulfonium salt structure.

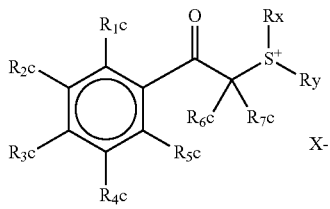

(ZI-3)

Each of $R_{1c}$ to $R_{5c}$ independently represents a hydrogen atom, an alkyl group, an alkoxy group or a halogen atom.

Each of $R_{6c}$ and $R_{7c}$ independently represents a hydrogen atom or an alkyl group.

Each of $R_x$ and $R_y$ independently represents an alkyl group, a 2-oxoalkyl group, an alkoxycarbonylmethyl group, an allyl group or a vinyl group.

Any two or more members out of $R_{1c}$ to $R_{7c}$ may combine to form a ring structure. Also, $R_x$ and $R_y$ may combine to form a ring structure. These ring structures may contain an oxygen atom, a sulfur atom, an ester bond or an amide bond.

$X^-$ has the same meaning as $Z^-$ in formula (ZI).

Specific examples of the compound (ZI-3) include the compounds set forth in paragraphs 0047 and 0048 of JP-A-2004-233661 and paragraphs 0040 to 0046 of JP-A-2003-35948.

Formulae (ZII) and (ZIII) are described below.

In formulae (ZII) and (ZIII), each of $R_{204}$ to $R_{207}$ independently represents an aryl group which may have a substituent, an alkyl group which may have a substituent, or a cycloalkyl group which may have a substituent.

Specific examples of the aryl group of $R_{204}$ to $R_{207}$ are the same as those described for the aryl group as $R_{201}$ to $R_{203}$ in compound (ZI-1).

Specific examples and preferred examples of the alkyl group and cycloalkyl group of $R_{204}$ to $R_{207}$ are the same as those described for the alkyl group and cycloalkyl group as $R_{201}$ to $R_{203}$ in compound (ZI-2).

$Z^-$ has the same meaning as $Z^-$ in formula (ZI).

Out of the compounds capable of generating an acid upon irradiation with an actinic ray or radiation, which are used as the acid generator (B), compounds represented by the following formulae (ZIV), (ZV) and (ZVI) are also preferred.

(ZIV)

(ZV)

(ZVI)

In formulae (ZIV) to (ZVI), each of $Ar_3$ and $Ar_4$ independently represents a substituted or unsubstituted aryl group.

Each $R_{208}$ in formulae (ZV) and (ZVI) independently represents a substituted or unsubstituted alkyl group, a substituted or unsubstituted cycloalkyl group, or a substituted or unsubstituted aryl group. From the standpoint of increasing the strength of the generated acid, $R_{208}$ is preferably substituted with a fluorine atom.

Each of $R_{209}$ and $R_{210}$ independently represents a substituted or unsubstituted alkyl group, a substituted or unsubstituted cycloalkyl group, a substituted or unsubstituted aryl group, or an electron-withdrawing group. $R_{209}$ is preferably a substituted or unsubstituted aryl group. $R_{210}$ is preferably an electron-withdrawing group, more preferably a cyano group or a fluoroalkyl group.

A represents a substituted or unsubstituted alkylene group, a substituted or unsubstituted alkenylene group, or a substituted or unsubstituted arylene group.

In the present invention, a compound having a plurality of structures represented by formula (ZVI) is also preferred. For example, the compound may be a compound having a structure that any one of $R_{209}$ to $R_{210}$ in the compound represented by formula (ZVI) is bonded to any one of $R_{209}$ to $R_{210}$ in another compound represented by formula (ZVI).

The acid generator (B) preferably contains at least either one of a diazodisulfone compound and a sulfonium salt. The diazodisulfone compound is preferably a compound represented by formula (ZIII), and the sulfonium salt is preferably a compound represented by formula (ZI).

Specific examples of the acid generator (B) are set forth below, but the present invention is not limited thereto.

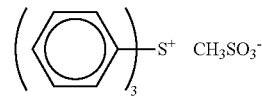

(B1)

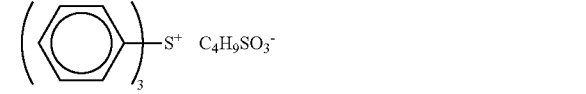

(B2)

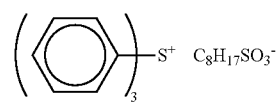

(B3)

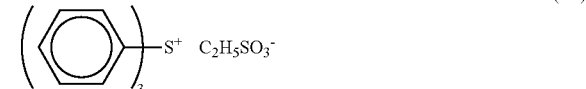

(B4)

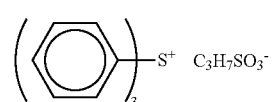

(B5)

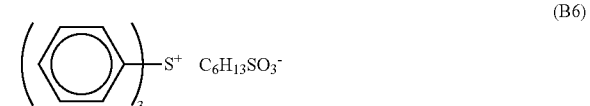

(B6)

-continued
(B7)
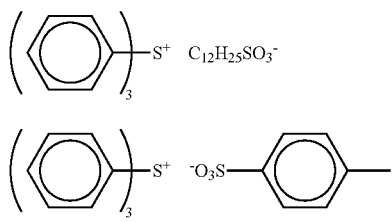
(B8)
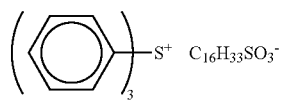
(B9)
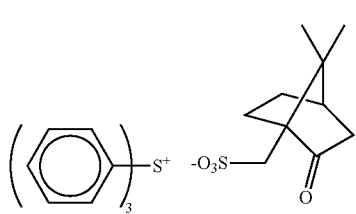
(B10)
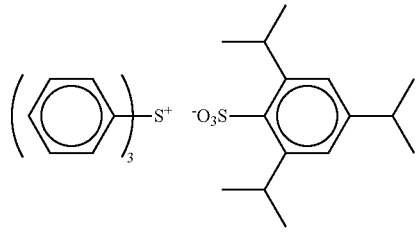
(B11)
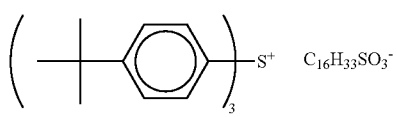
(B12)
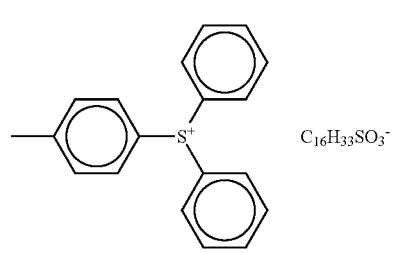
(B13)
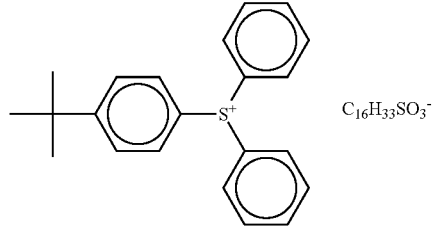
(B14)
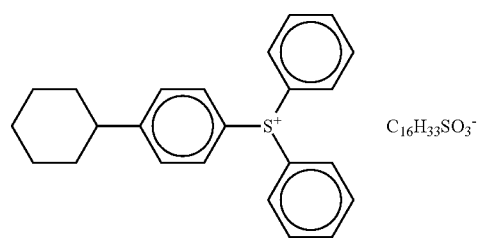
(B15)
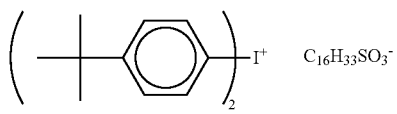
(B16)
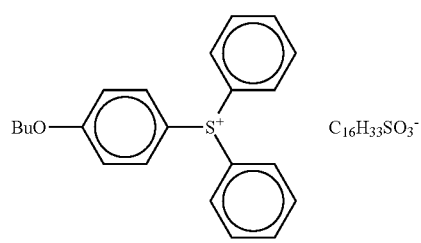
(B17)
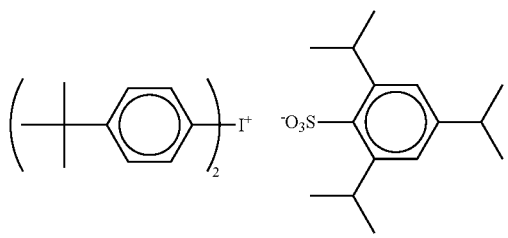
(B18)
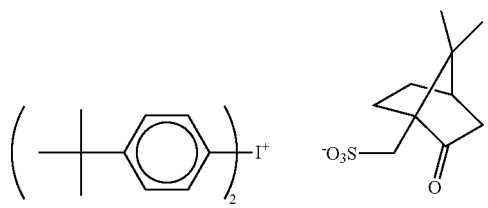
(B19)
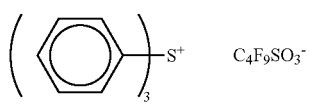
(B20)
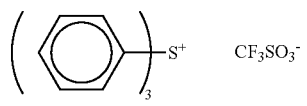
(B21)
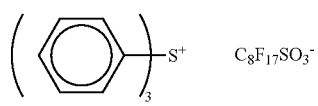

-continued
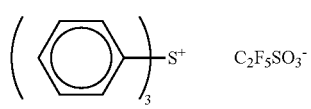 (B23)
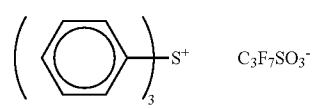 (B24)
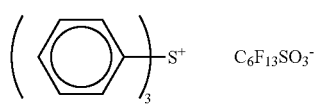 (B25)
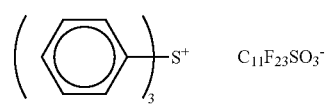 (B26)
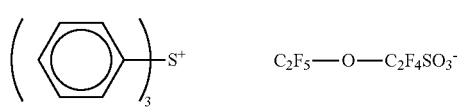 (B27)
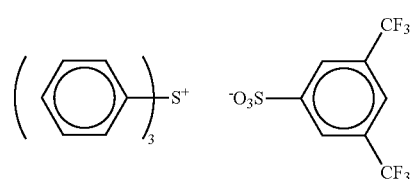 (B28)
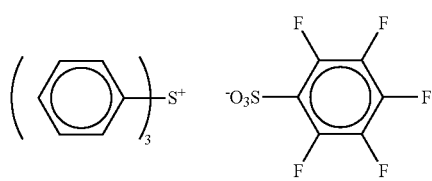 (B29)
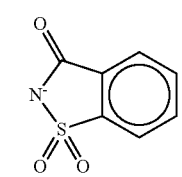 (B30)
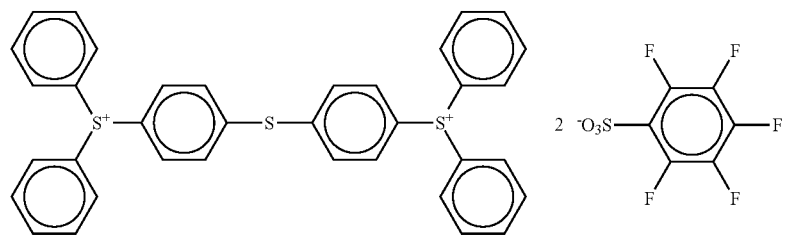 (B31)
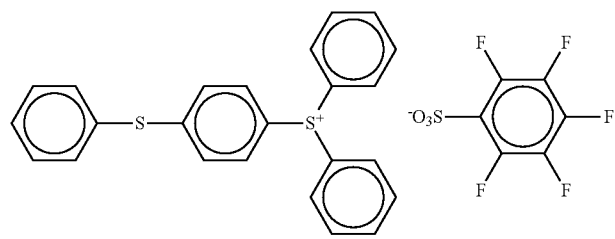 (B32)
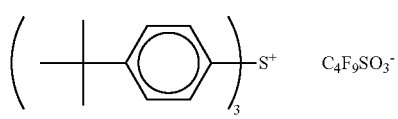 (B33)
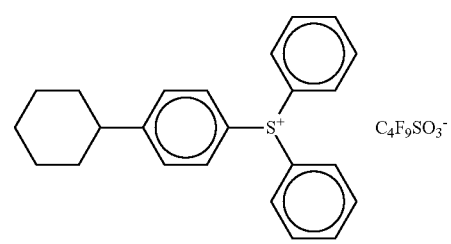 (B34)
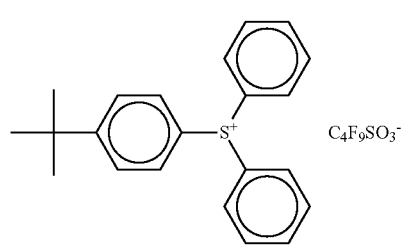 (B35)
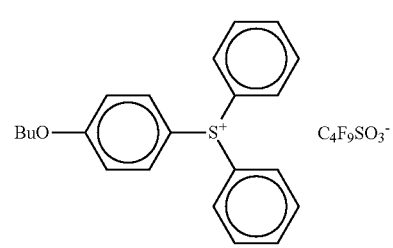 (B36)

-continued
(B37)
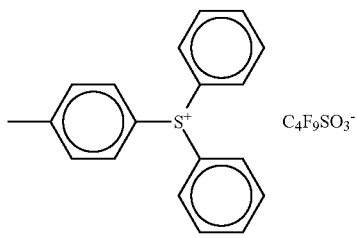
(B38)
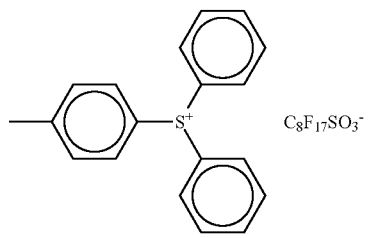
(B39)
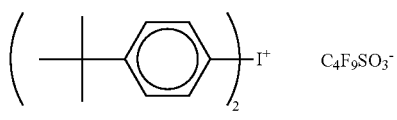
(B40)
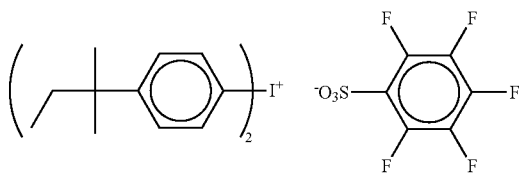
(B41)
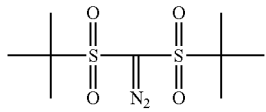
(B42)
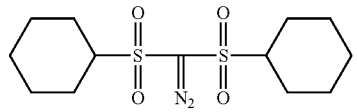
(B43)
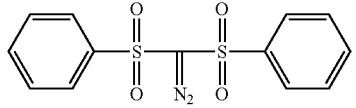
(B44)
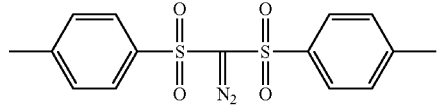
(B45)
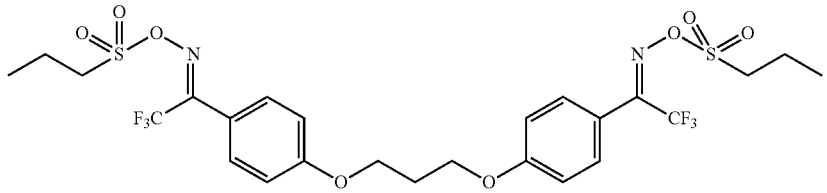
(B46)
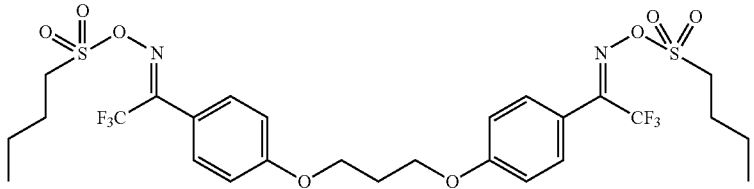
(B47)
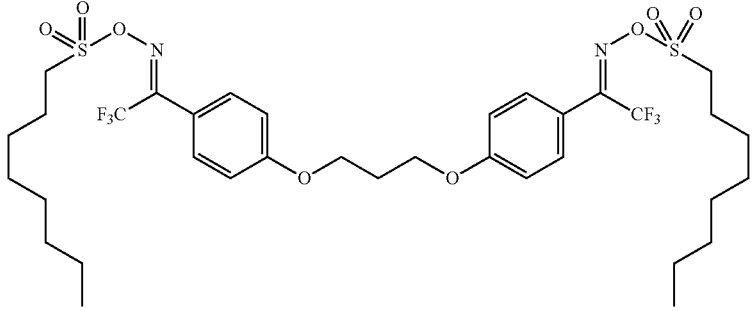

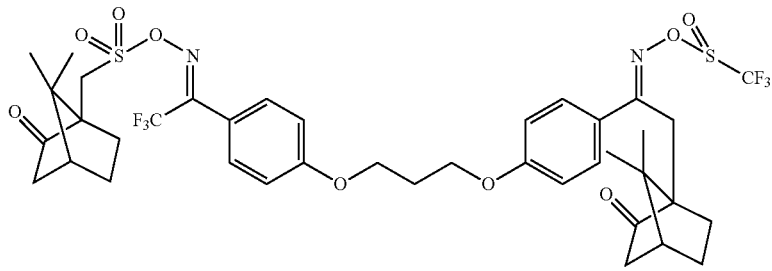
(B48)
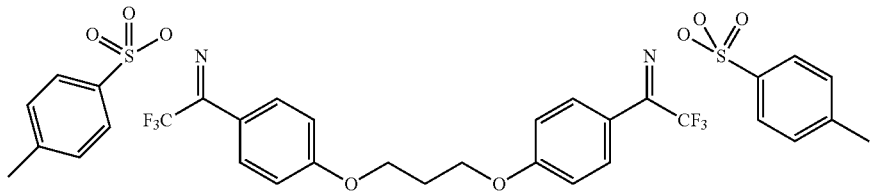
(B49)
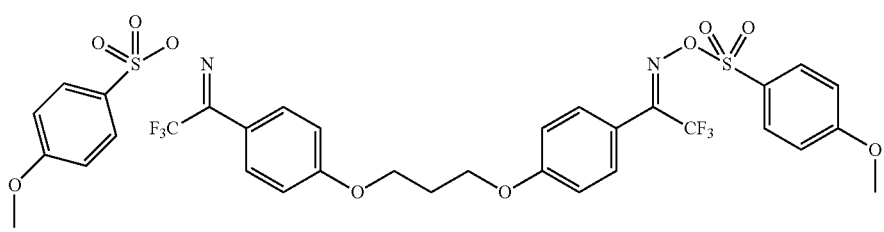
(B50)
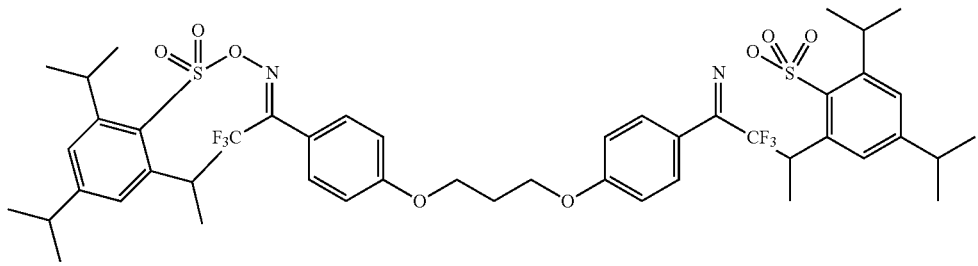
(B51)
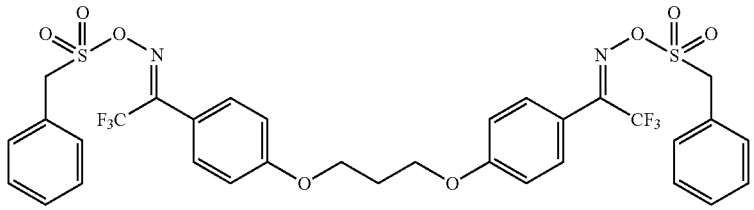
(B52)
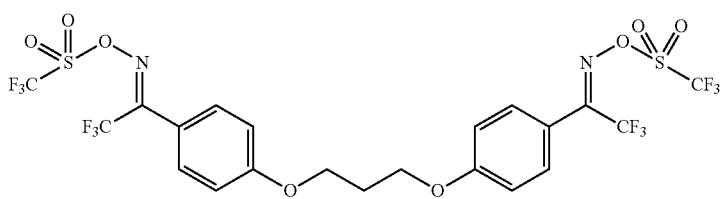
(B53)
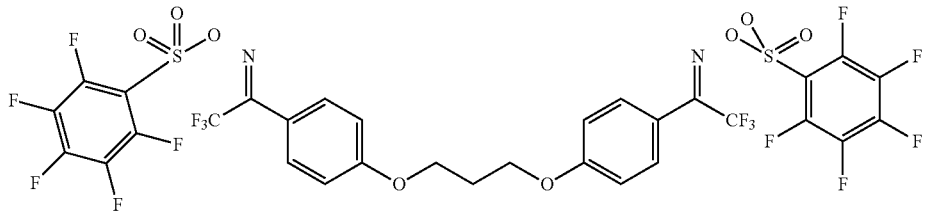
(B54)

-continued
(B55) 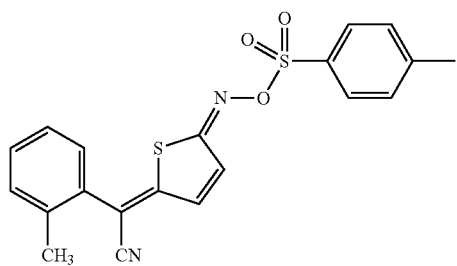
(B56) 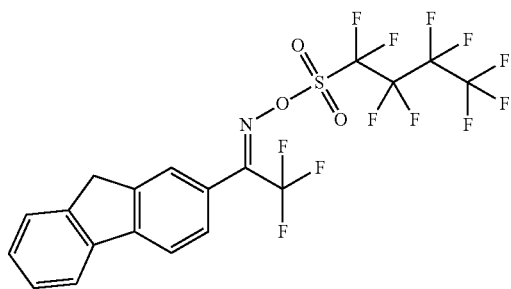
(B57) 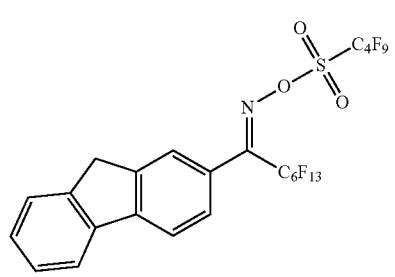
(B58) 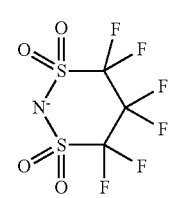
(B59) 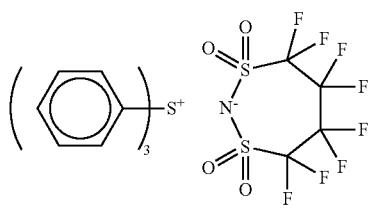
(B60) 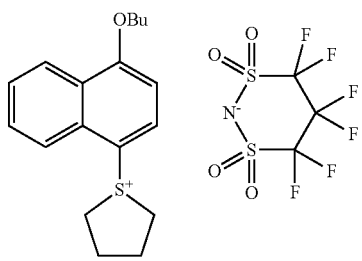
(B61) 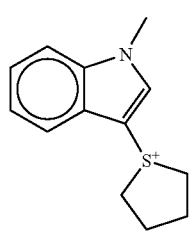
(B62) 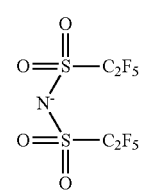
(B63) 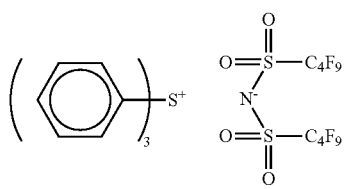
(B64) 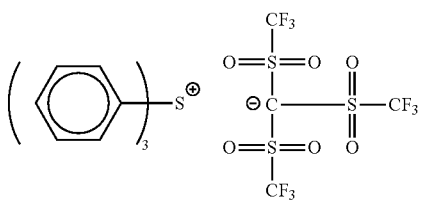
(B65) 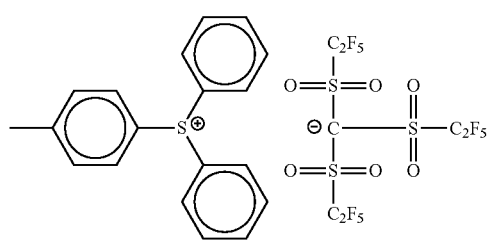
(B66) 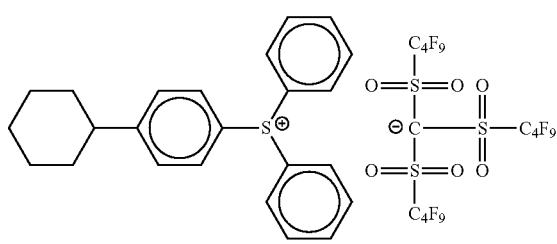

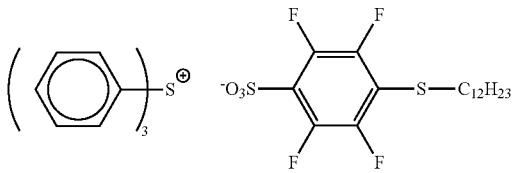

(B67)

As for the acid generator (B), one kind of a compound may be used alone, or two or more kinds of compounds may be used in combination. In the case of using two or more kinds of compounds in combination, two or more kinds of compounds capable of generating organic acids differing in the number of all atoms excluding hydrogen atom by 2 or more are preferably combined.

The content of the acid generator (B) in the composition is preferably from 0.1 to 20 mass %, more preferably from 0.5 to 10 mass %, still more preferably from 1 to 7 mass %, based on the entire solid content of the actinic ray-sensitive or radiation-sensitive resin composition.

[3] Organic Basic Compound (C)

The actinic ray-sensitive or radiation-sensitive resin composition of the present invention preferably contains a basic compound.

The basic compound is preferably a nitrogen-containing organic basic compound. The usable compound is not particularly limited, but, for example, compounds classified into the following (1) to (4) are preferably used.

(1) Compound Represented by the Following Formula (BS-1):

$$\underset{R}{\overset{R}{\underset{|}{R-N-R}}}$$ (BS-1)

In formula (BS-1), each R independently represents any of a hydrogen atom, an alkyl group (linear or branched), a cycloalkyl group (monocyclic or polycyclic), an aryl group and an aralkyl group, but it is not allowed that three R's all are a hydrogen atom.

The carbon number of the alkyl group as R is not particularly limited but is usually from 1 to 20, preferably from 1 to 12.

The carbon number of the cycloalkyl group as R is not particularly limited but is usually from 3 to 20, preferably from 5 to 15.

The carbon number of the aryl group as R is not particularly limited but is usually from 6 to 20, preferably from 6 to 10. Specific examples thereof include a phenyl group and a naphthyl group.

The carbon number of the aralkyl group as R is not particularly limited but is usually from 7 to 20, preferably from 7 to 11. Specific examples thereof include a benzyl group.

In the alkyl group, cycloalkyl group, aryl group and aralkyl group as R, a hydrogen atom may be replaced by a substituent. Examples of the substituent include an alkyl group, a cycloalkyl group, an aryl group, an aralkyl group, a hydroxyl group, a carboxyl group, an alkoxy group, an aryloxy group, an alkylcarbonyloxy group and an alkyloxycarbonyl group.

In the compound represented by formula (BS-1), it is preferred that only one of three R's is a hydrogen atom or all R's are not a hydrogen atom.

Specific examples of the compound represented by formula (BS-1) include tri-n-butylamine, tri-n-pentylamine, tri-n-octylamine, tri-n-decylamine, triisodecylamine, dicyclohexylmethylamine, tetradecylamine, pentadecylamine, hexadecylamine, octadecylamine, didecylamine, methyloctadecylamine, dimethylundecylamine, N,N-dimethyldodecylamine, methyldioctadecylamine, N,N-dibutylaniline, N,N-dihexylaniline, 2,6-diisopropylaniline and 2,4,6-tri(tert-butyl)aniline.

Also, one preferred embodiment is a compound where in formula (BS-1), at least one R is an alkyl group substituted with a hydroxyl group. Specific examples of the compound include triethanolamine and N,N-dihydroxyethylaniline.

The alkyl group as R may contain an oxygen atom in the alkyl chain to form an oxyalkylene chain. The oxyalkylene chain is preferably —CH$_2$CH$_2$O—. Specific examples thereof include tris(methoxyethoxyethyl)amine and compounds illustrated in U.S. Pat. No. 6,040,112, column 3, line 60 et seq.

(2) Compound Having a Nitrogen-Containing Heterocyclic Structure

The heterocyclic structure may or may not have aromaticity, may contain a plurality of nitrogen atoms, and may further contain a heteroatom other than nitrogen. Specific examples of the compound include a compound having an imidazole structure (e.g., 2-phenylbenzimidazole, 2,4,5-triphenylimidazole), a compound having a piperidine structure (e.g., N-hydroxyethylpiperidine, bis(1,2,2,6,6-pentamethyl-4-piperidyl)sebacate), a compound having a pyridine structure (e.g., 4-dimethylaminopyridine), and a compound having an antipyrine structure (e.g., antipyrine, hydroxyantipyrine).

A compound having two or more ring structures is also suitably used. Specific examples thereof include 1,5-diazabicyclo[4.3.0]non-5-ene and 1,8-diazabicyclo[5.4.0]undec-7-ene.

(3) Phenoxy Group-Containing Amine Compound

The phenoxy group-containing amine compound is a compound where the alkyl group of an amine compound has a phenoxy group at the terminal opposite the nitrogen atom. The phenoxy group may have a substituent such as alkyl group, alkoxy group, halogen atom, cyano group, nitro group, carboxyl group, carboxylic acid ester group, sulfonic acid ester group, aryl group, aralkyl group, acyloxy group and aryloxy group.

A compound having at least one oxyalkylene chain between the phenoxy group and the nitrogen atom is preferred. The number of oxyalkylene chains in one molecule is preferably from 3 to 9, more preferably from 4 to 6. Among oxyalkylene chains, —CH$_2$CH$_2$O— is preferred.

Specific examples of the compound include 2-[2-{2-(2,2-dimethoxy-phenoxyethoxy)ethyl}-bis-(2-methoxyethyl)]-amine and Compounds (C1-1) to (C3-3) illustrated in paragraph [0066] of U.S. Patent Application Publication No. 2007/0224539A1.

(4) Ammonium Salt

An ammonium salt may also be appropriately used. The ammonium salt is preferably a hydroxide or a carboxylate. More specifically, a tetraalkylammonium hydroxide typified by tetrabutylammonium hydroxide is preferred.

Other examples of the basic compound which can be used include compounds synthesized in Examples of JP-A-2002-363146 and compounds described in paragraph 0108 of JP-A-2007-298569.

As for the basic compound, one kind of a compound is used alone, or two or more kinds of compounds are used in combination.

The amount of the basic compound used is usually from 0.001 to 10 mass %, preferably from 0.01 to 5 mass %, based on the solid content of the composition.

The molar ratio of [acid generator (component (B))/[basic compound (component (C))] is preferably from 2.5 to 300. That is, the molar ratio is preferably 2.5 or more in view of sensitivity and resolution and is preferably 300 or less from the standpoint of suppressing the reduction in resolution due to thickening of the pattern with aging after exposure until heat treatment. This molar ratio is more preferably from 5.0 to 200, still more preferably from 7.0 to 150.

[4] Surfactant (D)

The actinic ray-sensitive or radiation-sensitive resin composition of the present invention preferably further contains a surfactant. The surfactant is preferably a fluorine-containing and/or silicon-containing surfactant.

Examples of the surfactant above include Megaface F176 and Megaface R08 produced by Dainippon Ink & Chemicals, Inc.; PF656 and PF6320 produced by OMNOVA; Troysol S-366 produced by Troy Chemical; Florad FC430 produced by Sumitomo 3M Inc.; and polysiloxane polymer KP-341 produced by Shin-Etsu Chemical Co., Ltd.

A surfactant other than the fluorine-containing and/or silicon-containing surfactant may also be used. Specific examples thereof include polyoxyethylene alkyl ethers and polyoxyethylene alkylaryl ethers.

In addition, known surfactants may be appropriately used. Examples of the surfactant which can be used include surfactants described in paragraph [0273] et seq. of U.S. Patent Application Publication No. 2008/0248425A1.

One kind of a surfactant may be used alone, or two or more kinds of surfactants may be used in combination.

The amount of the surfactant used is preferably from 0.0001 to 2 mass %, more preferably from 0.001 to 1 mass %, based on the entire solid content of the composition.

[5] Solvent (E)

The actinic ray-sensitive or radiation-sensitive resin composition of the present invention is dissolved in a solvent capable of dissolving respective components described above and then applied on a support. Usually, the concentration is, in terms of the solid content concentration of all components in the composition, preferably from 2 to 30 mass %, more preferably from 3 to 25 mass %.

The solvent used here contains ethyl lactate. In the case where the solvent is a mixed solvent, the ratio of ethyl lactate is, based on all solvents, preferably from 10 to 40 mass % and in view of skirt trailing and surface roughness of pattern, more preferably from 20 to 40 mass %.

Ethyl lactate is hydrophilic and therefore, has a property of being permeable to the developer but liable to remain in the resist film. Thanks to this property, ethyl lactate is considered to produce an effect of accelerating dissolution of the resist film in a developer and thereby enable reducing the surface roughness or skirt trailing in the pattern obtained.

The ratio of ethyl lactate is 10 mass % or more, so that a sufficiently large amount of ethyl lactate can remain in the resist film and in turn, the surface roughness and skirt trailing in the pattern obtained can be adequately reduced. On the other hand, the ratio of ethyl lactate is 40 mass % or less, so that the thickness uniformity of the resist film in the wafer plane can be more increased.

Preferred examples of the solvent that can be used in combination with ethyl lactate include ethylene dichloride, cyclohexanone, cyclopentanone, anisole, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether (PGME, another name: 1-methoxy-2-propanol), propylene glycol monomethyl ether acetate (PGMEA, another name: 1-methoxy-2-acetoxypropane), toluene, ethyl acetate, methyl lactate, methyl methoxypropionate, ethyl ethoxypropionate, methyl pyruvate, ethyl pyruvate, propyl pyruvate, N,N-dimethylformamide, dimethylsulfoxide, N-methylpyrrolidone and tetrahydrofuran. One of these solvents may be used alone, or some of them may be mixed and used. Propylene glycol monomethyl ether acetate and propylene glycol monomethyl ether are more preferred as the solvent used in combination with ethyl lactate.

[6] Other Components

In addition, the actinic ray-sensitive or radiation-sensitive resin composition of the present invention may appropriately contain, for example, a compound capable of generating a carboxylic acid upon irradiation with an actinic ray or radiation, a carboxylic acid such as benzoic acid, a dye, a photobase generator, an antioxidant (for example, phenolic antioxidants disclosed in paragraphs 0130 to 0133 of JP-A-2006-276688), and a compound capable of producing an acid upon irradiation with radiation and thereby being decreased in the basicity or becoming neutral described in JP-A-2006-330098 and Japanese Patent 3,577,743.

The pattern forming method of the present invention includes steps of forming a film by using the actinic ray-sensitive or radiation-sensitive resin composition (positive resist composition), and exposing and developing the film.

Usually, the resist composition of the present invention is applied on a substrate to form a thin film. The thickness of this coating film is preferably from 0.05 to 4.0 µm.

In the present invention, if desired, a commercially available inorganic or organic antireflection film may be provided as at least either an overlayer or an underlayer of the resist, for example, by coating.

The antireflection film used as the underlayer of the resist may be either an inorganic film type such as titanium, titanium dioxide, titanium nitride, chromium oxide, carbon and amorphous silicon, or an organic film type composed of a light absorber and a polymer material. The former requires equipment for the film formation, such as vacuum deposition apparatus, CVD apparatus and sputtering apparatus. Examples of the organic antireflection film include a film composed of a diphenylamine derivative/formaldehyde-modified melamine resin condensate, an alkali-soluble resin and a light absorber described in JP-B-7-69611 (the term "JP-B" as used herein means an "examined Japanese patent publication"); a reaction product of a maleic anhydride copolymer and a diamine-type light absorber described in U.S. Pat. No. 5,294,680; a film containing a resin binder and a methylolmelamine-based thermal crosslinking agent described in JP-A-6-118631; an acrylic resin-type antireflection film containing a carboxylic acid group, an epoxy group and a light absorbing group within the same molecule described in JP-A-6-118656; a film composed of methylolmelamine and a benzophenone-based light absorber described in JP-A-8-87115; and a film obtained by adding a low molecular light absorber to a polyvinyl alcohol resin described in JP-A-8-179509.

A commercially available organic antireflection film such as DUV-30 Series and DUV-40 Series produced by Brewer Science, Inc. and AR-2, AR-3 and AR-5 produced by Shipley Co., Ltd., may also be used as the organic antireflection film.

As regards the organic antireflection film for the overlayer of the resist, an organic antireflection film such as AQUATAR-II, AQUATAR-III and AQUATAR-VII produced by AZ Electronic Materials K.K. may also be used.

In the production or the like of a precision integrated circuit device, the step of forming a pattern on a resist film is performed by applying the positive resist composition of the present invention on a substrate (for example, a silicon/silicon dioxide-coated substrate, a substrate produced by vapor depositing silicon nitride on the silicon substrate surface, a silicon nitride substrate, a titanium nitride substrate, a glass substrate, an ITO substrate, a quartz/chromium oxide-coated substrate, or a substrate produced by applying a hexamethyldisilane treatment to the substrate above for the purpose of enhancing the adhesion to the resist film) to form a resist film, irradiating an actinic ray or radiation such as KrF excimer laser light, ArF excimer laser light, electron beam or EUV light (preferably KrF excimer laser light, electron beam or EUV light), and then subjecting the resist film to heating, development, rinsing and drying, whereby a good resist pattern can be formed.

The alkali developer which can be used in the development is an aqueous solution of alkalis (usually, from 0.1 to 20 mass %) such as inorganic alkalis (e.g., sodium hydroxide, potassium hydroxide, sodium carbonate, sodium silicate, sodium metasilicate, aqueous ammonia), primary amines (e.g., ethylamine, n-propylamine), secondary amines (e.g., diethylamine, di-n-butylamine), tertiary amines (e.g., triethylamine, methyldiethylamine), alcohol amines (e.g., dimethylethanolamine, triethanolamine), quaternary ammonium salts (e.g., tetramethylammonium hydroxide, tetraethylammonium hydroxide, choline) and cyclic amines (e.g., pyrrole, piperidine). This aqueous solution of alkalis can also be used after adding thereto alcohols such as isopropyl alcohol and a surfactant such as nonionic surfactant, each in an appropriate amount.

Among these developers, a quaternary ammonium salt is preferred, and tetramethylammonium hydroxide and choline are more preferred.

The pH of the alkali developer is usually from 10 to 15.

EXAMPLES

The present invention is described in greater detail below by referring to Examples, but the contents of the present invention should not be construed as being limited thereto.

Synthesis Example 1

Synthesis of Resin ((A-1)-1)

Poly(p-hydroxystyrene) (50 g) (molecular weight: 15,000) produced by Nippon Soda Co., Ltd. was dissolved in 240 g of propylene glycol monomethyl ether acetate (PGMEA), and the resulting solution was depressurized to 20 mmHg at 60° C. to distill off about 40 g of the solvent together with water remaining in the system. After cooling to 20° C., 6.1 g of ethyl vinyl ether, 4.0 g of cyclohexyl vinyl ether and 0.02 g of para-toluenesulfonic acid were added thereto, and the mixture was stirred at room temperature for 1 hour. Subsequently, the reaction solution was neutralized by adding 0.02 g of triethylamine, and an extraction operation with 240 g of ethyl acetate and 140 g of water was performed three times. The obtained resin was designated as ((A-1)-1).

Resins ((A-1)-2), (A-4) and (A-5) were synthesized by the same method as in Synthesis Example 1.

Synthesis Example 2

Synthesis of Resin ((A-2)-1)

p-tert-Butoxystyrene (176.3 g (1.0 mol)) and 16.2 g (0.105 mol) of cyclohexyl acrylate were dissolved in 250 ml of isopropanol, and in a nitrogen stream, 2,2'-azobisisobutyronitrile was added. The mixture was allowed to undergo a polymerization reaction at 75° C. for 6 hours. The reaction solution was cooled and then poured in 5,000 ml of methanol for crystallization. The precipitated crystal was collected by filtration, washed with methanol and dried under reduced pressure to obtain 172.5 g of poly(p-tert-butoxystyrene/cyclohexyl acrylate) as white powder crystal. The component ratio between p-tert-butoxystyrene unit and cyclohexyl acrylate unit in the obtained resin was found to be about 90:10 from $^1$HNMR and $^{13}$CNMR measurements. Also, the results of GPC measurement using polystyrene as a standard were Mw of about 20,600 and Mw/Mn of 1.55.

Poly(p-tert-butoxystyrene/cyclohexyl acrylate) (130.5 g) obtained above was suspended in isopropanol, and 30 ml of concentrated hydrochloric acid was added thereto. The mixture was reacted with stirring at 70 to 80° C. for 4 hours, and the reaction solution was cooled and then poured in 1,500 ml of water for crystallization. The precipitated crystal was collected by filtration, washed with water and dried under reduced pressure to obtain 85.5 g of poly(p-hydroxystyrene/cyclohexyl acrylate) as white powder crystal. The component ratio between p-hydroxystyrene unit and cyclohexyl acrylate unit in the obtained polymer was found to be about 90:10 from $^1$HNMR measurement. Also, the results of GPC measurement using polystyrene as a standard were Mw of about 14,800 and Mw/Mn of 1.50.

Poly(p-hydroxystyrene/cyclohexyl acrylate) (24.7 g) obtained above and 4.6 g of ethyl vinyl ether were dissolved in ethyl acetate, and a catalytic amount of pyridinium p-toluenesulfonate was added thereto. The mixture was reacted with stirring at room temperature for 5 hours and after the reaction, the reaction solution was poured in 3,000 ml of water for recrystallization. The precipitated crystal was collected by filtration, washed with water and dried under reduced pressure to obtain 26.1 g of poly(p-1-ethoxyethoxystyrene/p-hydroxystyrene/cyclohexyl acrylate) as white powder crystal. The component ratio between p-1-ethoxyethoxystyrene unit, p-hydroxystyrene unit and cyclohexyl acrylate unit in the obtained polymer was found to be about 20:70:10 from $^1$HNMR and $^{13}$CNMR measurements. Also, the results of GPC measurement using polystyrene as a standard were Mw of about 17,500 and Mw/Mn of 1.50.

Polymers ((A-2)-2) and (A-3) were synthesized by the same method as in Synthesis Example 2.

The compositional ratio, mass average molecular weight (Mw) and molecular weight polydispersity (Mw/Mn) of resins synthesized are shown in Table 1. Incidentally, Resins ((A-1)-1) and ((A-1)-2) have structure (A-1) and differ in the compositional ratio, molecular weight or polydispersity, and Resins ((A-2)-1) and ((A-2)-2) have structure (A-2) and differ in the compositional ratio, molecular weight or polydispersity.

TABLE 1

| Resin | Compositional Ratio (mol %) | | | | Mass Average Molecular Weight (Mw) | Polydispersity (Mw/Mn) |
| --- | --- | --- | --- | --- | --- | --- |
| | Formula (I) | Formula (II) | Formula (III-a) | Formula (III-b) | | |
| (A-1)-1 | 72 | 24 | 4 | 0 | 18,900 | 1.15 |
| (A-1)-2 | 68 | 28 | 4 | 0 | 18,500 | 1.18 |
| (A-2)-1 | 70 | 20 | 0 | 10 | 17,500 | 1.50 |
| (A-2)-2 | 68 | 25 | 0 | 7 | 15,300 | 1.62 |
| A-3 | 67 | 7 | 0 | 26 | 13,000 | 1.65 |
| A-4 | 75 | 5 | 20 | 0 | 18,600 | 1.19 |
| A-5 | 70 | 25 | 5 | 0 | 18,600 | 1.13 |
| A-6 | 80 | 20 | 0 | 0 | 18,300 | 1.17 |

(1) Preparation of Positive Resist

The components shown in Table 2 below were dissolved in the solvent to prepare a solution having a solid content concentration of 14.5 mass %, and the solution obtained was microfiltered through a polytetrafluoroethylene filter having a pore size of 0.1 µm to prepare a resist solution.

Resist solutions used for evaluation are shown in Table 2. Here, the amount added (mass %) of each component except for solvents (the numerical value in the parenthesis of the Table) means mass % based on the solid content excluding solvents. As for the solvent, the mixing ratio (mass %) of respective solvents is shown.

TABLE 2

|  | Resin | Acid Generator | Basic Compound | Surfactant | Solvent PGMEA | PGME | Ethyl Lactate | Methyl Lactate |
|---|---|---|---|---|---|---|---|---|
| Example 1 | (A-1)-1 (95.6) | (B42)/(B44) (3.0/1.0) | (C-2)/(C-3) (0.2/0.2) | — | 70 | 0 | 30 | 0 |
| Example 2 | (A-1)-1 (95.5) | (B8) (4.0) | (C-2)/(C-3) (0.2/0.2) | W-2 (0.1) | 60 | 0 | 40 | 0 |
| Example 3 | (A-1)-1 (95.5) | (B41)/(B37) (1.0/3.0) | (C-1) (0.4) | W-2 (0.1) | 60 | 0 | 40 | 0 |
| Example 4 | A-5 (95.5) | (B42)/(B44) (3.0/1.0) | (C-2)/(C-3) (0.2/0.2) | W-2 (0.1) | 60 | 0 | 40 | 0 |
| Example 5 | (A-1)-2 (95.5) | (B67) (4.0) | (C-2)/(C-3) (0.2/0.2) | W-2 (0.1) | 60 | 0 | 40 | 0 |
| Example 6 | (A-1)-2 (95.5) | (B58) (4.0) | (C-1) (0.4) | W-2 (0.1) | 60 | 0 | 40 | 0 |
| Example 7 | (A-2)-1 (95.5) | (B42)/(B44) (3.0/1.0) | (C-2)/(C-3) (0.2/0.2) | W-2 (0.1) | 60 | 0 | 40 | 0 |
| Example 8 | (A-2)-1 (95.5) | (B67) (4.0) | (C-2)/(C-3) (0.2/0.2) | W-2 (0.1) | 60 | 0 | 40 | 0 |
| Example 9 | (A-2)-1 (95.5) | (B41)/(B67) (1.0/3.0) | (C-1) (0.4) | W-2 (0.1) | 60 | 0 | 40 | 0 |
| Example 10 | (A-2)-2 (95.5) | (B42)/(B44) (3.0/1.0) | (C-2)/(C-3) (0.2/0.2) | W-2 (0.1) | 60 | 0 | 40 | 0 |
| Example 11 | (A-2)-2 (95.5) | (B8) (4.0) | (C-2)/(C-3) (0.2/0.2) | W-2 (0.1) | 60 | 0 | 40 | 0 |
| Example 12 | (A-2)-2 (95.5) | (B41)/(B2) (1.0/3.0) | (C-1) (0.4) | W-2 (0.1) | 60 | 0 | 40 | 0 |
| Example 13 | (A-2)-2 (95.5) | (B39) (4.0) | (C-3) (0.4) | W-2 (0.1) | 60 | 0 | 40 | 0 |
| Example 14 | A-3 (95.5) | (B42)/(B44) (3.0/1.0) | (C-2)/(C-3) (0.2/0.2) | W-2 (0.1) | 60 | 0 | 40 | 0 |
| Example 15 | A-4 (95.5) | (B42)/(B44) (3.0/1.0) | (C-2)/(C-3) (0.2/0.2) | W-2 (0.1) | 60 | 0 | 40 | 0 |
| Example 16 | A-4 (95.5) | (B42)/(B67) (1.0/3.0) | (C-1) (0.4) | W-1 (0.1) | 80 | 0 | 20 | 0 |
| Comparative Example 1 | A-6 (95.5) | (B42)/(B67) (1.0/3.0) | (C-2)/(C-3) (0.2/0.2) | W-2 (0.1) | 60 | 40 | 0 | 0 |
| Comparative Example 2 | A-6 (95.5) | (B42)/(B67) (1.0/3.0) | (C-1) (0.4) | W-2 (0.1) | 60 | 0 | 40 | 0 |
| Comparative Example 3 | (A-2)-1 (95.5) | (B8) (4.0) | (C-2)/(C-3) (0.2/0.2) | W-1 (0.1) | 60 | 0 | 0 | 40 |

Abbreviations in the Table indicate the following compounds denoted by respective abbreviation codes. However, the abbreviations for the acid generator indicate the compounds set forth above in the Mode for Carrying Out the Invention and denoted by respective abbreviation codes.

<Resin>

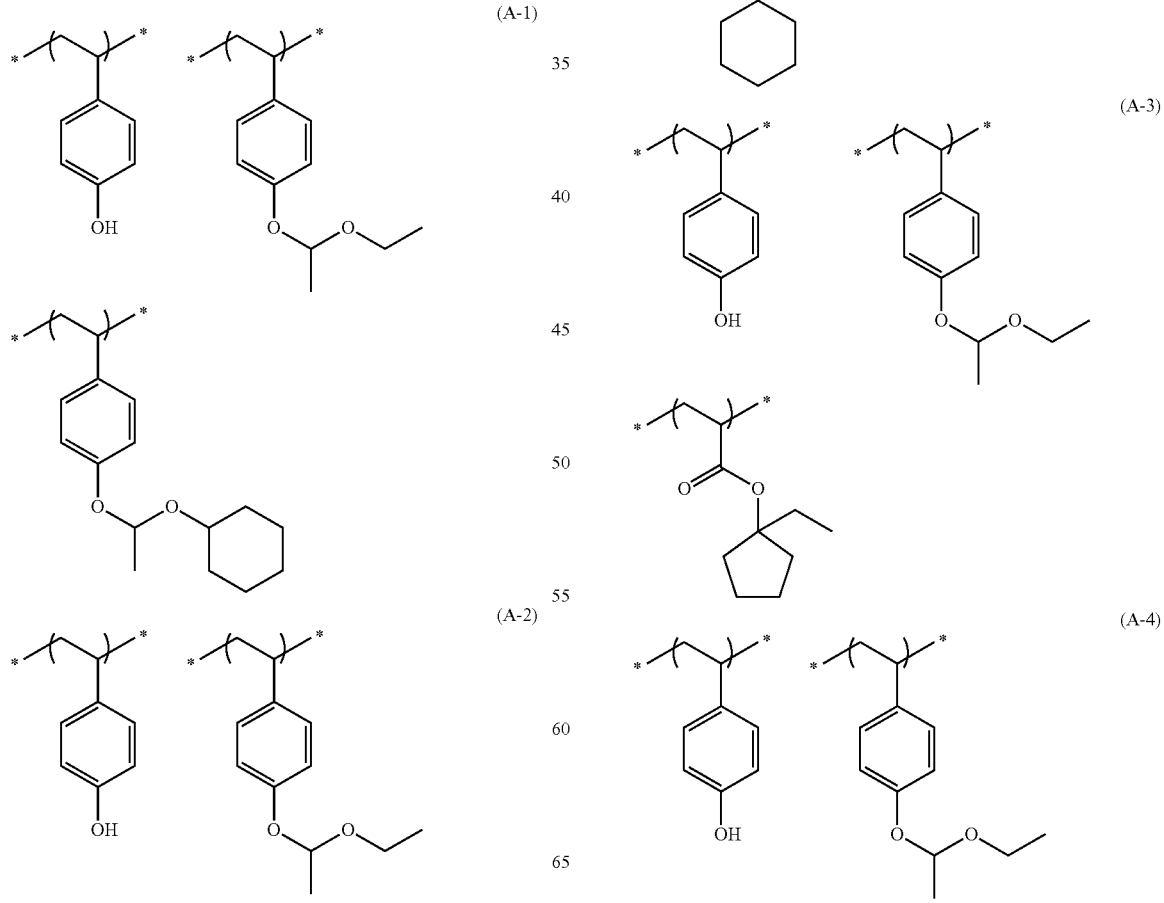

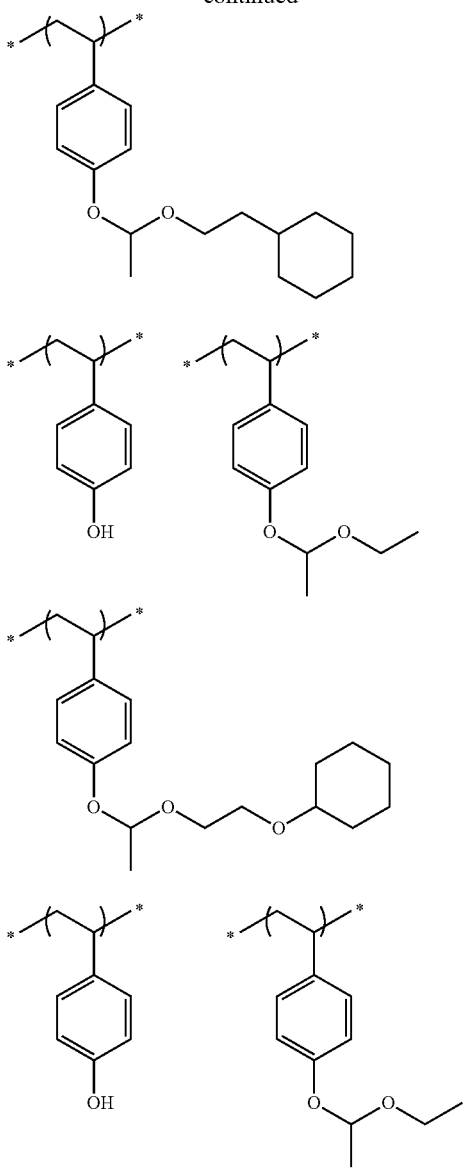

<Basic Compound>
C-1: Dicyclohexylmethyl amine
C-2: Tetra-(n-butyl)ammonium hydroxide

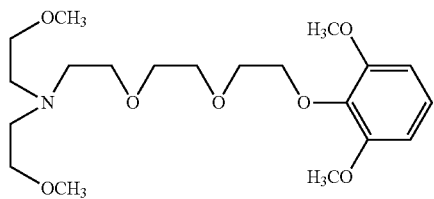
(C-3)

<Surfactant>
W-1: Megaface F176 (produced by Dainippon Ink & Chemicals, Inc.)
W-2: PF6320 (produced by OMNOVA)

(2) Formation and Evaluation of Positive Resist Pattern (KrF exposure)

A 8-inch wafer obtained by vapor depositing SiN on silicon to a thickness of 100 nm was subjected to a hexamethyldisilazane treatment by using a spin coater, ACTS, manufactured by Tokyo Electron Ltd., and the resist solution prepared above was applied thereon and baked at 90° C. for 90 seconds to obtain a film having an average thickness of 600 nm.

Pattern exposure of the obtained resist film was performed using a KrF excimer laser scanner (PAS5500/850C, manufactured by ASML, wavelength: 248 nm, NA=0.60, Sigma=0.70). At this time, a binary mask was used as the reticle.

After the exposure, the film was baked at 110° C. for 60 seconds, dipped in an aqueous 2.38 mass % tetramethylammonium hydroxide (TMAH) solution for 60 seconds, rinsed with water for 30 seconds and dried. The obtained pattern was evaluated by the following methods.

(2-1) Sensitivity

The line width of the obtained pattern was observed by a scanning electron microscope (S-8840, manufactured by Hitachi, Ltd.), and the irradiation energy when resolving a line having a line width of 180 nm (in the mask, line size=170 nm, line:space=1:1.2) was taken as the sensitivity (Eopt).

(2-2) Exposure Latitude (EL)

By measuring the line width with respect to the exposure dose in the same manner as above, the exposure dose giving a line width at ±10% of the target size 180 nm, that is, a line width of 162 nm and a line width of 198 nm, was determined, and the exposure latitude (EL) defined by the following formula was calculated. A larger value indicates smaller exposure latitude and higher resolution.

$$[EL\ (\%)] = [(\text{exposure dose giving a line width of 162 nm}) - (\text{exposure dose giving a line width of 198 nm})]/(Eopt)$$

(2-3) Evaluation of LER

A line pattern having a line width of 180 nm at the sensitivity obtained in (2-1) was observed by a scanning microscope (S8840, manufactured by Hitachi, Ltd.) and with respect to the range of 2 μm in the longitudinal direction of the line pattern, the distance to the actual edge from the reference line where the edge should be present was measured at 50 points at regular intervals. The standard deviation of the measured value was determined, and 3σ was computed. A smaller value indicates higher performance.

(2-4) Defocus Latitude (DOF)

The exposure was performed at the sensitivity determined in (2-1) by changing the focus, and the line width with respect to the focus was measured in the same manner as above. The fluctuation amplitude of focus allowing the measured value of line width to fall within ±10% of a target line width 180 nm, that is, from a line width of 162 nm to a line width of 198 nm, was taken as the focus latitude (DOF) (μm). A larger value indicates wider focus latitude (DOF).

(2-5) Skirt Trailing

The cross-sectional profile of a line having a line width of 180 nm at the sensitivity obtained in (2-1) (in the mask, line size=170 nm, line:space=1:1.2) was observed by a scanning electron microscope (S-4800, manufactured by Hitachi Ltd.), and assuming that, as shown in FIG. 1, the line width at the top of a line 1 provided on a substrate 2 is X (nm) and the line width at the bottom is Z (nm), the skirt trailing was evaluated based on Y (nm) obtained according to the following formula. A smaller Y value indicates shorter skirt trailing and is preferred.

$$Y = (Z - X)/2$$

(2-6) Surface Roughness

The pattern surface containing a line having a line width 180 nm at the sensitivity obtained in (2-1) (in the mask, line size=170 nm, line:space=1:1.2) was observed by a scanning microscope (S8840, manufactured by Hitachi, Ltd.), and the degree of surface roughness was evaluated on the following 5-step scale.

5: The pattern top is very smooth, and the pattern edge has no white portion.

4: The pattern top is very smooth, and the width of the white portion in the pattern edge is 10 nm or less.

3: The pattern top is slightly rough, and the width of the white portion in the pattern edge is 10 nm or less.

2: The pattern top is slightly rough, and the width of the white portion in the pattern edge is more than 10 nm and less than 30 nm.

1: The pattern top is significantly rough, and the width of the white portion in the pattern edge is 30 nm or more.

Evaluations results of Examples 1 to 16 and Comparative Examples 1 to 3 are shown in Table 3 below.

TABLE 3

|  | Eopt (mJ/cm$^2$) | EL (%) | LER (nm) | DOF (μm) | Skirt Tailing (nm) | Surface Roughness |
|---|---|---|---|---|---|---|
| Example 1 | 15 | 18 | 8 | 0.4 | 5 | 4 |
| Example 2 | 10 | 19 | 8 | 0.5 | 4 | 5 |
| Example 3 | 12 | 18 | 7 | 0.5 | 1 | 4 |
| Example 4 | 17 | 19 | 9 | 0.5 | 5 | 4 |
| Example 5 | 12 | 20 | 8 | 0.4 | 3 | 4 |
| Example 6 | 14 | 19 | 7 | 0.5 | 1 | 4 |
| Example 7 | 15 | 23 | 5 | 0.7 | 3 | 5 |
| Example 8 | 10 | 25 | 5 | 0.6 | 2 | 5 |
| Example 9 | 11 | 25 | 7 | 0.5 | 1 | 4 |
| Example 10 | 12 | 24 | 6 | 0.7 | 3 | 5 |
| Example 11 | 14 | 23 | 5 | 0.7 | 2 | 4 |
| Example 12 | 17 | 22 | 6 | 0.6 | 2 | 5 |
| Example 13 | 23 | 19 | 9 | 0.4 | 7 | 3 |
| Example 14 | 21 | 18 | 8 | 0.3 | 5 | 4 |
| Example 15 | 20 | 17 | 7 | 0.4 | 3 | 4 |
| Example 16 | 18 | 18 | 7 | 0.4 | 3 | 4 |
| Comparative Example 1 | 30 | 12 | 13 | 0.25 | 15 | 1 |
| Comparative Example 2 | 28 | 12 | 15 | 0.30 | 15 | 1 |
| Comparative Example 3 | 19 | 15 | 10 | 0.45 | 8 | 4 |

It is seen from Table 3 that with respect to pattern formation by KrF excimer laser exposure, the resist composition of the present invention can achieve high sensitivity, high resolution, wide focus latitude (DOF) performance, good LER performance, reduction of skirt trailing, and reduction of pattern surface roughness, as compared to reference Examples.

(3) Formation and Evaluation of Positive Resist Pattern (Electron Beam (EB) Exposure)

The same resist solution as used in (2) (KrF exposure) except for changing the solid content concentration to 8 mass % was applied on a hexamethyldisilazane-treated silicone wafer by using a spin coater, Mark 8, manufactured by Tokyo Electron Ltd. and baked at 100° C. for 90 seconds to obtain a film having an average thickness of 300 nm.

This resist film was irradiated with an electron beam by using an electron beam lithography apparatus (HL750, manufactured by Hitachi, Ltd., accelerating voltage: 50 KeV). After the irradiation, the film was baked at 110° C. for 60 seconds, dipped in an aqueous 2.38 mass % tetramethylammonium hydroxide (TMAH) solution for 60 seconds, rinsed with water for 30 seconds and dried. The obtained pattern was evaluated by the following methods.

(3-1) Sensitivity

The line width of the obtained pattern was observed by a scanning electron microscope (S-9260, manufactured by Hitachi, Ltd.), and the irradiation energy when resolving a line having a line width of 150 nm (line:space=1:1) was taken as the sensitivity.

(3-2) Evaluation of Resolution

The minimum value of the resolvable line width in the resolving of a line:space=1:1 pattern at the sensitivity obtained in (3-1) was observed by the above-described scanning electron microscope.

(3-3) Evaluation of LER

A line pattern having a line width of 150 nm at the sensitivity obtained in (3-1) was observed by a scanning microscope (S9260, manufactured by Hitachi, Ltd.) and with respect to the range of 2 μm in the longitudinal direction of the line pattern, the distance to the actual edge from the reference line where the edge should be present was measured at 50 points at regular intervals. The standard deviation was determined, and 3σ was computed. A smaller value indicates higher performance.

Evaluation results in the EB exposure are shown in Table 4.

TABLE 4

|  | Sensitivity (μC/cm$^2$) | Resolution (nm) | LER (nm) |
|---|---|---|---|
| Example 1 | 25 | 30 | 5 |
| Example 2 | 5 | 50 | 3 |
| Example 3 | 7 | 40 | 5 |
| Example 4 | 25 | 50 | 5 |
| Example 5 | 6 | 30 | 3 |
| Example 6 | 10 | 40 | 5 |
| Example 7 | 27 | 30 | 5 |
| Example 8 | 5 | 50 | 4 |
| Example 9 | 8 | 60 | 5 |
| Example 10 | 30 | 50 | 5 |
| Example 11 | 7 | 40 | 5 |
| Example 12 | 5 | 50 | 4 |
| Example 13 | 30 | 70 | 10 |
| Example 14 | 13 | 50 | 5 |
| Example 15 | 30 | 50 | 5 |
| Example 16 | 20 | 60 | 5 |
| Comparative Example 1 | 50 | 100 | 13 |
| Comparative Example 2 | 52 | 110 | 14 |
| Comparative Example 3 | 31 | 80 | 10 |

It is seen from the results in Table 4 that with respect to pattern formation by electron beam irradiation, the resist composition of the present invention exhibits high sensitivity, high resolution and excellent LER performance as compared to Comparative Examples.

(4) Formation and Evaluation of Positive Resist Pattern (EUV Exposure)

The same resist solution as used in (2) (KrF exposure) except for changing the solid content concentration to 5 mass % was applied on a hexamethyldisilazane-treated silicone wafer by using a spin coater, Mark 8, manufactured by Tokyo Electron Ltd. and baked at 100° C. for 90 seconds to obtain a film having an average thickness of 100 nm.

This resist film was exposed to EUV light (wavelength: 13 nm, EUVES, manufactured by Lithotrack Japan), further baked at 110° C. for 60 seconds, and then developed with an aqueous 2.38 mass % tetramethylammonium hydroxide (TMAH) solution. A sensitivity curve was obtained by measuring the dissolution rate of the resist film in the developer at each exposure dose while varying the exposure dose in steps of 0.5 mJ/cm$^2$ within the range of from 0 to 20.0 mJ/cm$^2$.

(Sensitivity and Resolution (Dissolution Contrast))

In the sensitivity curve, the exposure dose when the dissolution rate of the resist is saturated was taken as the sensitivity. Also, as the index of resolution, a dissolution contrast (γ value) was calculated from the gradient in the straight line part of the sensitivity curve. A larger γ value indicates more excellent dissolution contrast and higher resolution.

Evaluation results of EUV exposure are shown in Table 5 below.

TABLE 5

| | Sensitivity (mJ/cm$^2$) | γ |
|---|---|---|
| Example 1 | 3.1 | 6.5 |
| Example 2 | 3.5 | 6.3 |
| Example 3 | 3.6 | 6.1 |
| Example 4 | 3.1 | 6.4 |
| Example 5 | 3.8 | 6.0 |
| Example 6 | 3.5 | 5.7 |
| Example 7 | 3.7 | 5.9 |
| Example 8 | 4.1 | 6.2 |
| Example 9 | 4.2 | 6.3 |
| Example 10 | 4.5 | 6.1 |
| Example 11 | 4.1 | 6.0 |
| Example 12 | 4.3 | 5.7 |
| Example 13 | 6.6 | 4.5 |
| Example 14 | 4.7 | 5.5 |
| Example 15 | 3.9 | 5.8 |
| Example 16 | 4.6 | 5.5 |
| Comparative Example 1 | 11.0 | 3.0 |
| Comparative Example 2 | 12.0 | 3.2 |
| Comparative Example 3 | 6.5 | 4.2 |

It is seen from Table 5 that with respect to pattern formation by EUV exposure, the resist composition of the present invention exhibits high sensitivity and high dissolution contrast as compared with Comparative Examples.

As revealed above, the resist composition of the present invention yielded good results also in EUV irradiation.

INDUSTRIAL APPLICABILITY

According to the present invention, an actinic ray-sensitive or radiation-sensitive resin composition ensuring that the sensitivity and resolution are high, the performance in terms of focus latitude (DOF) and line edge roughness (LER) is excellent, and the pattern can be reduced in the skirt trailing and pattern surface roughness, and a pattern forming method using the composition, can be provided.

This application is based on Japanese patent application No. 2009-159327 filed on Jul. 3, 2009, the entire content of which is hereby incorporated by reference, the same as if set forth at length.

The invention claimed is:

1. An actinic ray-sensitive or radiation-sensitive resin composition, comprising:
    (A) a resin that contains a repeating unit represented by the following formula (I), a repeating unit represented by the following formula (II) and a repeating unit represented by the following formula (III-a);
    (B) a compound capable of generating an acid upon irradiation with an actinic ray or radiation; and
    (C) a solvent,
    wherein the solvent (C) contains ethyl lactate:

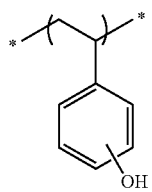
(I)

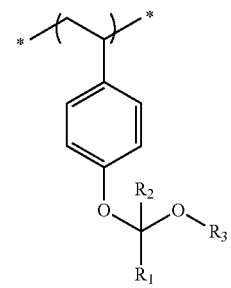
(II)

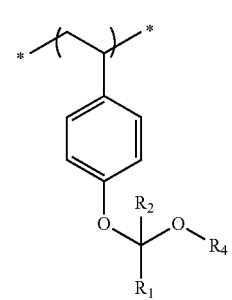
(III-a)

wherein in formula (II), each of $R_1$ and $R_2$ independently represents a hydrogen atom, an alkyl group or a cycloalkyl group, and $R_3$ represents an alkyl group; and
in formula (III-a), each of $R_1$ and $R_2$ independently represents a hydrogen atom, an alkyl group or a cycloalkyl group, and $R_4$ represents a group containing a cycloalkyl group.

2. The actinic ray-sensitive or radiation-sensitive resin composition according to claim 1,
    wherein in formula (II), either one of $R_1$ and $R_2$ is a hydrogen atom; and
    in formula (III-a), either one of $R_1$ and $R_2$ is a hydrogen.

3. The actinic ray-sensitive or radiation-sensitive resin composition according to claim 1,
    wherein the repeating unit represented by formula (III-a) is a repeating unit represented by the following formula (III-a'):

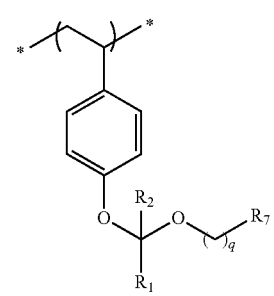
(III-a')

wherein in formula (III-a'), each of $R_1$ and $R_2$ independently represents a hydrogen atom, an alkyl group or a cycloalkyl group, $R_7$ represents a cycloalkyl group, and q represents an integer of 0 to 2.

4. The actinic ray-sensitive or radiation-sensitive resin composition according to claim 1,
    wherein the ratio of the repeating unit represented by formula (III-a) is from 1 to 30 mol % based on all repeating units of the resin (A).

5. The actinic ray-sensitive or radiation-sensitive resin composition according to claim 1,
wherein the ratio of ethyl lactate is from 10 to 40 mass % based on the entire amount of the solvent (C).

6. The actinic ray-sensitive or radiation-sensitive resin composition according to claim 1,
wherein the compound (B) contains at least either one of a diazodisulfone compound and a sulfonium salt.

7. A film that is formed from the actinic ray-sensitive or radiation-sensitive resin composition according to claim 1.

8. A pattern forming method, comprising:
forming a film from the actinic ray-sensitive or radiation-sensitive resin composition according to claim 1; and
exposing and developing the film.

9. The actinic ray-sensitive or radiation-sensitive resin composition according to claim 1, wherein the compositional ratio of the repeating unit represented by formula (I) in the resin (A) is from 55 to 85 mol % based on all repeating units in the resin (A).

10. The actinic ray-sensitive or radiation-sensitive resin composition according to claim 1, wherein the compositional ratio of the repeating unit represented by formula (II) in the resin (A) is from 14 to 40 mol % based on all repeating units in the resin (A).

11. The actinic ray-sensitive or radiation-sensitive resin composition according to claim 1, wherein $R_4$ in formula (III-a) contains a monocyclic cycloalkyl group.

12. The actinic ray-sensitive or radiation-sensitive resin composition according to claim 1, wherein the content of the resin (A) in the composition is from 80 to 99 mass %, based on the entire solids content of the composition.

13. The actinic ray-sensitive or radiation-sensitive resin composition according to claim 1, wherein the composition further contains an ammonium salt.

* * * * *